(12) United States Patent
Sawada et al.

(10) Patent No.: US 9,449,944 B2
(45) Date of Patent: Sep. 20, 2016

(54) ELECTRONIC COMPONENT PACKAGE AND METHOD FOR MANUFACTURING SAME

(71) Applicant: Panasonic Intellectual Property Management Co., Ltd., Osaka (JP)

(72) Inventors: Susumu Sawada, Osaka (JP); Seiichi Nakatani, Osaka (JP); Yoshihisa Yamashita, Kyoto (JP); Koji Kawakita, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/422,615

(22) PCT Filed: Dec. 20, 2013

(86) PCT No.: PCT/JP2013/007502
§ 371 (c)(1),
(2) Date: Feb. 19, 2015

(87) PCT Pub. No.: WO2014/097642
PCT Pub. Date: Jun. 26, 2014

(65) Prior Publication Data
US 2015/0228619 A1     Aug. 13, 2015

(30) Foreign Application Priority Data
Dec. 21, 2012  (JP) ................... 2012-279840

(51) Int. Cl.
*H01L 31/0203*     (2014.01)
*H01L 25/065*      (2006.01)
(Continued)

(52) U.S. Cl.
CPC ......... *H01L 25/0655* (2013.01); *H01L 21/288* (2013.01); *H01L 21/56* (2013.01);
(Continued)

(58) Field of Classification Search
CPC ............... H01L 31/0203; H01L 27/14618; H01L 27/14683; H01L 2924/01079; H01L 2924/01078
USPC .................. 257/98, 433, 687, 724
See application file for complete search history.

(56) References Cited

U.S. PATENT DOCUMENTS

| 4,835,067 A | 5/1989 | Levine |
| 4,889,584 A | 12/1989 | Wada et al. |

(Continued)

FOREIGN PATENT DOCUMENTS

| JP | 1-98237 | 4/1989 |
| JP | 5-121615 | 5/1993 |

(Continued)

OTHER PUBLICATIONS

English translation of the International Preliminary Report on Patentability issued Jun. 23, 2015 in International (PCT) Application No. PCT/JP2013/007505.

(Continued)

*Primary Examiner* — Quoc Hoang
(74) *Attorney, Agent, or Firm* — Wenderoth, Lind & Ponack, L.L.P.

(57) ABSTRACT

There is provided a method for manufacturing an electronic component package, wherein a first electronic component and a second electronic component are placed on a carrier, and a sealing resin layer is formed on the carrier, followed by the carrier being peeled away to be removed, and thereby providing a package precursor in which the first and second electronic components are embedded such that an electrode of at least one of the first and second electronic components is exposed at a surface of the sealing resin layer. Upon the placing of the first and second electronic components, the first and second electronic components are positioned such that their height levels differ from each other. After the removal of the carrier, a metal plating layer is formed such that the metal plating layer is in contact with the exposed surface of the electrode of the at least one of the first and second electronic components.

9 Claims, 14 Drawing Sheets

(51) Int. Cl.

| | |
|---|---|
| H01L 33/54 | (2010.01) |
| H01L 33/62 | (2010.01) |
| H01L 23/31 | (2006.01) |
| H01L 21/56 | (2006.01) |
| H01L 23/00 | (2006.01) |
| H01L 21/288 | (2006.01) |
| H01L 23/538 | (2006.01) |
| H01L 25/16 | (2006.01) |
| H01L 25/00 | (2006.01) |
| H01L 33/50 | (2010.01) |
| H01L 21/48 | (2006.01) |
| H01L 25/075 | (2006.01) |
| H01L 23/433 | (2006.01) |
| H01L 23/367 | (2006.01) |

(52) U.S. Cl.
CPC .......... *H01L 21/561* (2013.01); *H01L 21/568* (2013.01); *H01L 23/3107* (2013.01); *H01L 23/3121* (2013.01); *H01L 23/3135* (2013.01); *H01L 23/5386* (2013.01); *H01L 24/83* (2013.01); *H01L 24/96* (2013.01); *H01L 25/167* (2013.01); *H01L 25/50* (2013.01); *H01L 33/507* (2013.01); *H01L 33/54* (2013.01); *H01L 33/62* (2013.01); *H01L 21/4878* (2013.01); *H01L 23/367* (2013.01); *H01L 23/433* (2013.01); *H01L 25/0753* (2013.01); *H01L 2224/16225* (2013.01); *H01L 2224/16245* (2013.01); *H01L 2224/48227* (2013.01); *H01L 2224/48247* (2013.01); *H01L 2224/73265* (2013.01); *H01L 2224/8385* (2013.01); *H01L 2924/01013* (2013.01); *H01L 2924/01022* (2013.01); *H01L 2924/01024* (2013.01); *H01L 2924/01028* (2013.01); *H01L 2924/01029* (2013.01); *H01L 2924/12041* (2013.01); *H01L 2924/12042* (2013.01); *H01L 2924/181* (2013.01); *H01L 2924/2064* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01); *H01L 2933/005* (2013.01); *H01L 2933/0041* (2013.01); *H01L 2933/0066* (2013.01)

(56) References Cited

U.S. PATENT DOCUMENTS

| | | | |
|---|---|---|---|
| 4,935,312 A | 6/1990 | Nakayama et al. | |
| 5,684,330 A | 11/1997 | Lee | |
| 6,180,263 B1 | 1/2001 | Naoi | |
| 6,319,834 B1 | 11/2001 | Erb et al. | |
| 6,452,258 B1 | 9/2002 | Abys et al. | |
| 6,453,549 B1 | 9/2002 | Bhatt et al. | |
| 6,475,877 B1 | 11/2002 | Saia et al. | |
| 6,566,258 B1 | 5/2003 | Dixit et al. | |
| 6,699,782 B2 | 3/2004 | Kim | |
| 7,132,020 B2 | 11/2006 | Nozawa et al. | |
| 7,202,107 B2 | 4/2007 | Fuergut et al. | |
| 7,285,446 B2 | 10/2007 | Shibata | |
| 7,416,763 B2 | 8/2008 | Kanda et al. | |
| 7,435,910 B2 | 10/2008 | Sakamoto et al. | |
| 7,855,389 B2* | 12/2010 | Ishikura | H01L 25/0753 257/79 |
| 7,927,922 B2 | 4/2011 | Shen et al. | |
| 8,062,537 B2 | 11/2011 | Tuominen et al. | |
| 8,114,712 B1 | 2/2012 | McConnelee et al. | |
| 8,237,259 B2 | 8/2012 | Pressel et al. | |
| 8,240,032 B2 | 8/2012 | Iihola et al. | |
| 8,699,233 B2* | 4/2014 | Palm | H01L 23/5384 174/260 |
| 2003/0026078 A1 | 2/2003 | Komatsubara et al. | |
| 2003/0060041 A1 | 3/2003 | Datta et al. | |
| 2005/0097735 A1 | 5/2005 | Kanda et al. | |
| 2006/0006404 A1 | 1/2006 | Ibbetson et al. | |
| 2006/0219428 A1 | 10/2006 | Chinda et al. | |
| 2007/0267136 A1 | 11/2007 | Tuominen et al. | |
| 2008/0261338 A1 | 10/2008 | Iihola et al. | |
| 2008/0314867 A1 | 12/2008 | Woychik et al. | |
| 2008/0318027 A1 | 12/2008 | Woychik et al. | |
| 2008/0318055 A1 | 12/2008 | Fillion et al. | |
| 2009/0027204 A1 | 1/2009 | Fujimaki et al. | |
| 2009/0275257 A1 | 11/2009 | Sun et al. | |
| 2009/0289362 A1 | 11/2009 | Rhyner et al. | |
| 2010/0155925 A1 | 6/2010 | Kunimoto et al. | |
| 2011/0061909 A1 | 3/2011 | Palm et al. | |
| 2011/0175213 A1 | 7/2011 | Mori et al. | |
| 2012/0040840 A1 | 2/2012 | Okayama et al. | |
| 2012/0218721 A1 | 8/2012 | Nishimura | |
| 2013/0056250 A1 | 3/2013 | Chung et al. | |
| 2013/0249080 A1 | 9/2013 | Lin et al. | |
| 2014/0210090 A1 | 7/2014 | Palm et al. | |
| 2015/0076545 A1* | 3/2015 | Nakatani | H01L 33/50 257/98 |

FOREIGN PATENT DOCUMENTS

| | | |
|---|---|---|
| JP | 9-64247 | 3/1997 |
| JP | 10-223832 | 8/1998 |
| JP | 2001-250888 | 9/2001 |
| JP | 2002-170921 | 6/2002 |
| JP | 2003-239082 | 8/2003 |
| JP | 2005-19754 | 1/2005 |
| JP | 2006-165322 | 6/2006 |
| JP | 2008-503076 | 1/2008 |
| JP | 2008-522396 | 6/2008 |
| JP | 2009-253284 | 10/2009 |
| JP | 2010-80528 | 4/2010 |
| JP | 2011-134817 | 7/2011 |
| JP | 2011-523773 | 8/2011 |
| JP | 2012-109306 | 6/2012 |
| JP | 2012-134500 | 7/2012 |
| WO | 2010/018708 | 2/2010 |
| WO | 2011/062252 | 5/2011 |

OTHER PUBLICATIONS

English translation of the International Preliminary Report on Patentability issued Jun. 23, 2015 in International (PCT) Application No. PCT/JP2013/007504.
English translation of the International Preliminary Report on Patentability issued Jun. 23, 2015 in International (PCT) Application No. PCT/JP2013/007503.
English translation of the International Preliminary Report on Patentability issued Jun. 23, 2015 in International (PCT) Application No. PCT/JP2013/007502.
English translation of the International Preliminary Report on Patentability issued Jun. 23, 2015 in International (PCT) Application No. PCT/JP2013/007501.
Office Action issued Dec. 4, 2015 in U.S. Appl. No. 14/422,505.
International Search Report issued Mar. 18, 2014 in International (PCT) Application No. PCT/JP2013/007502.
International Search Report issued Mar. 18, 2014 in International (PCT) Application No. PCT/JP2013/007501.
International Search Report issued Mar. 18, 2014 in International (PCT) Application No. PCT/JP2013/007503.
International Search Report issued Mar. 18, 2014 in International (PCT) Application No. PCT/JP2013/007504.
International Search Report issued Mar. 18, 2014 in International (PCT) Application No. PCT/JP2013/007505.
U.S. Office Action issued Feb. 22, 2016 in corresponding U.S. Appl. No. 14/422,294.
U.S. Office Action issued May 5, 2016 in corresponding U.S. Appl. No. 14/422,990.
U.S. Office Action mailed May 26, 2016 in corresponding U.S. Appl. No. 14/422,972.

\* cited by examiner

Fig. 2A
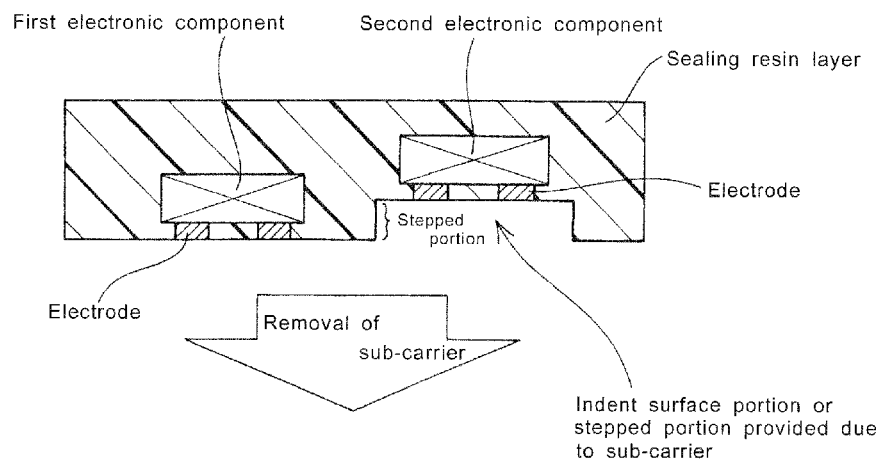
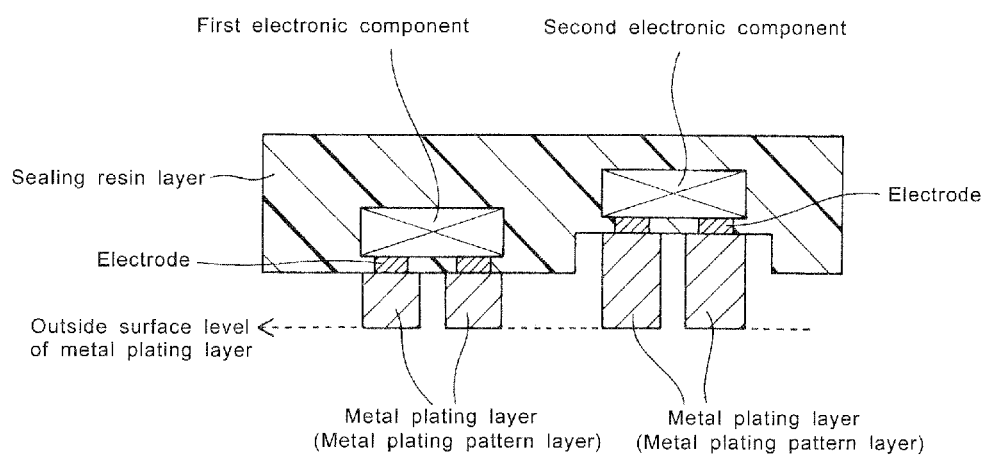

Fig. 2B
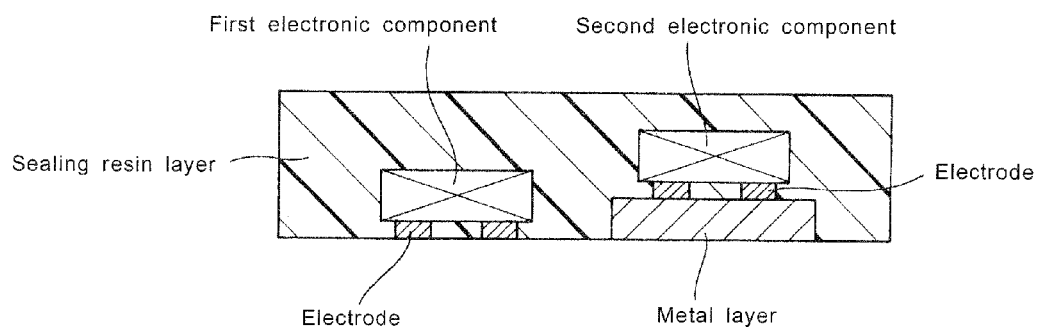
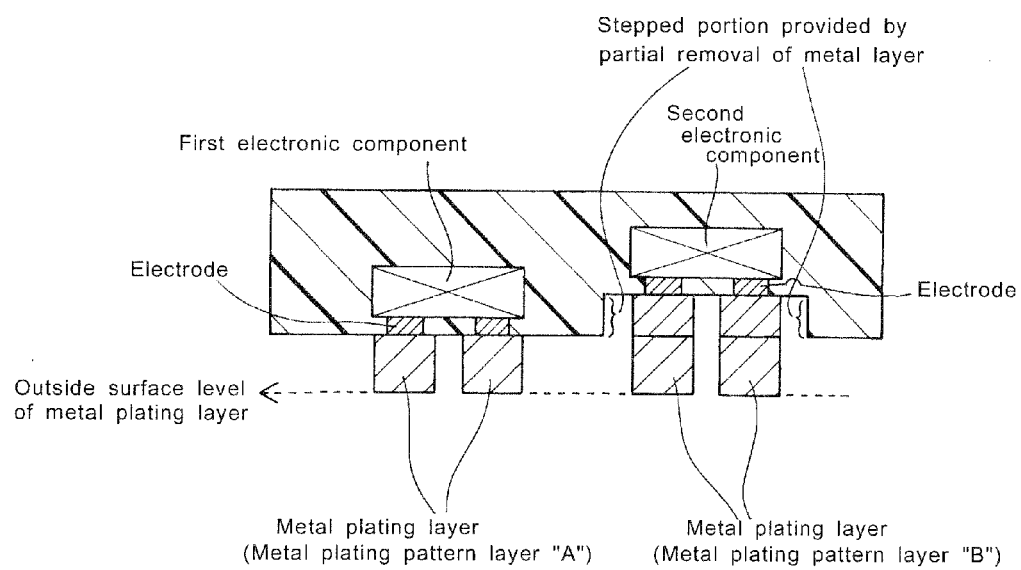

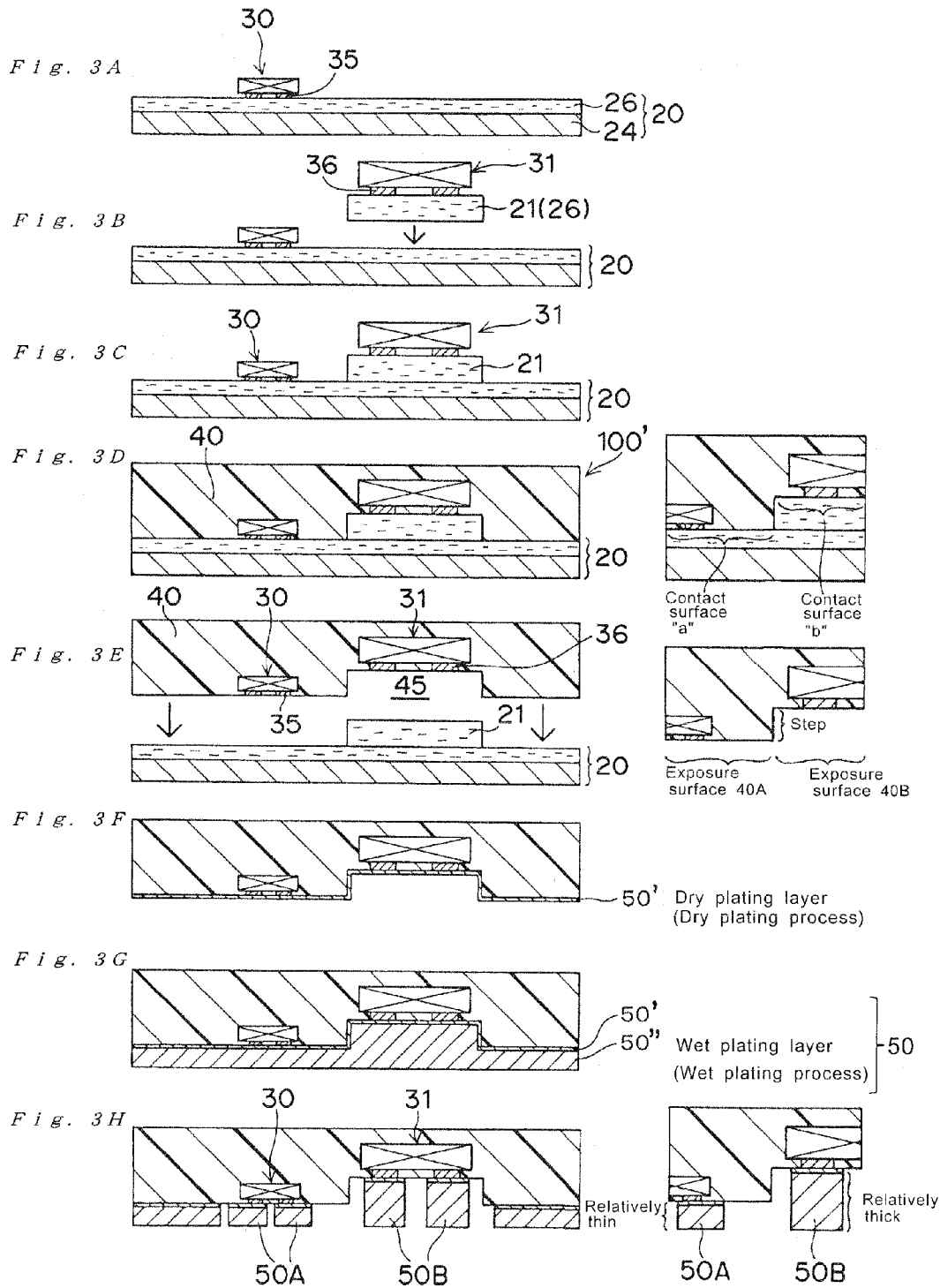

Dicing operation

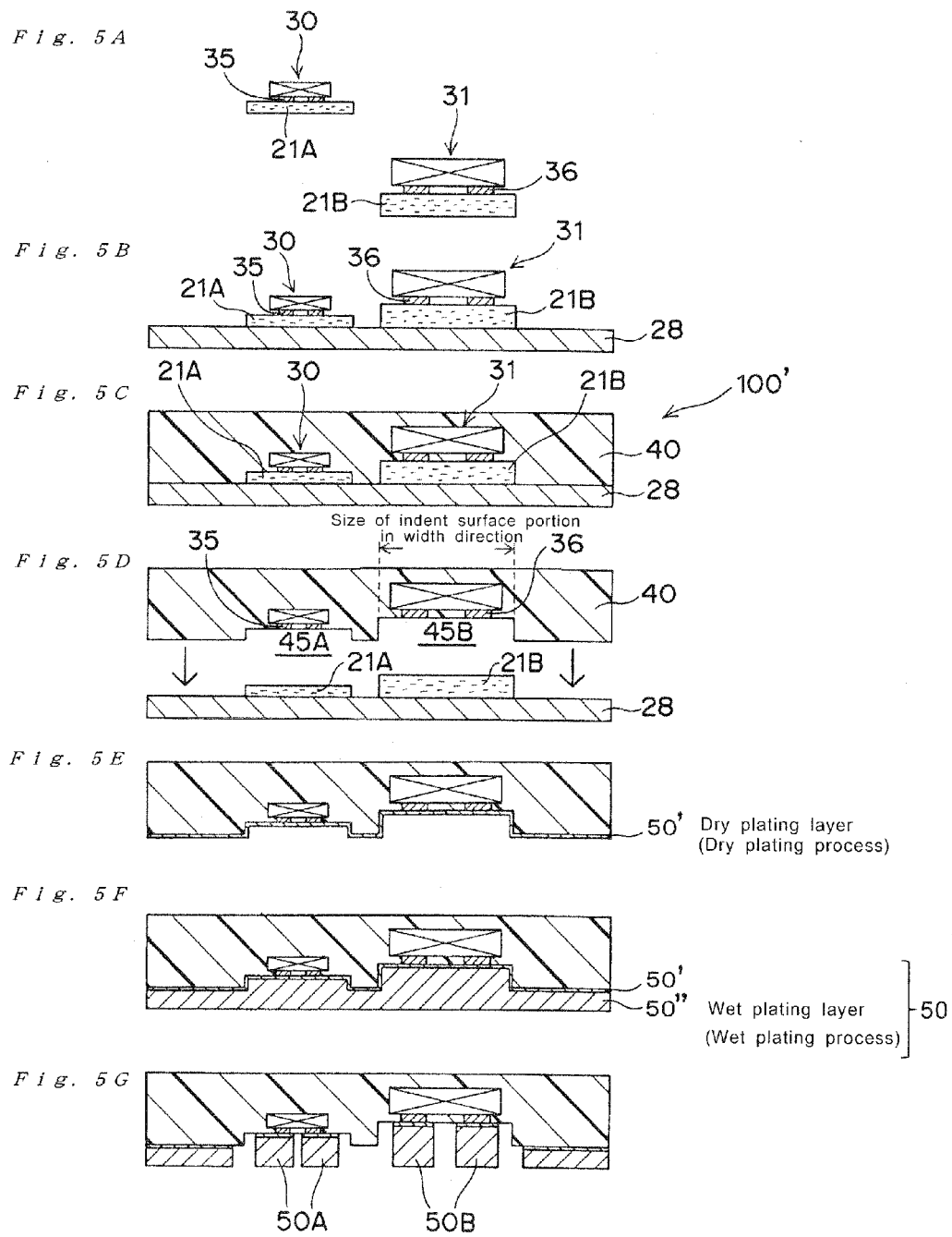

Package with circuit substrate
(Wiring-bonding type / Flip-chip type)

Package with lead frame

ELECTRONIC COMPONENT PACKAGE AND METHOD FOR MANUFACTURING SAME

TECHNICAL FIELD

The present disclosure relates to an electronic component package and a method for manufacturing the electronic component package. More particularly, the present disclosure relates to a package product equipped with an electronic component, and a method for manufacturing such package product.

BACKGROUND OF THE INVENTION

With the advance of electronic devices, various package technologies have been developed in the electronics field. For example, a packaging (i.e., packaging technique) using a circuit substrate or a lead frame has been developed for a mounting of electronic components such as IC and inductor. That is, there have been used "package with circuit substrate" and "package with lead frame" as a general package form for the electronic component.

"Package with circuit substrate" (see FIG. 14A) has such a form that the electronic component has been mounted on the circuit substrate. This package is generally classified as "Wire Bonding type (W/B type)" and "Flip Chip type (F/C type)". While on the other hand, "package with lead frame" (see FIG. 14B) has such a form that a lead frame, which may be composed of a lead or die pad, is included therein. In this lead frame-type package as well as the circuit substrate-type package, a bonding of the various electronic components is provided by a soldering or the like.

PATENT DOCUMENTS

Prior Art Patent Documents

PATENT DOCUMENT 1: U.S. Pat. No. 7,927,922
PATENT DOCUMENT 2: U.S. Pat. No. 7,202,107
PATENT DOCUMENT 3: JP2008-522396

SUMMARY OF THE INVENTION

The technologies of the prior art cannot provide a satisfactory performance in terms of a heat releasing and a connection reliability in a high-density packaging.

Under the above circumstances, an embodiment of the present invention has been created. In other words, an object of an embodiment of the present invention is to provide an electronic component package and a manufacturing method therefor, which can achieve an improvement of the heat releasing and the connection reliability in the high-density packaging.

In order to achieve the above-mentioned object, an embodiment of the present invention provides a method for manufacturing an electronic component package, wherein a first electronic component and a second electronic component are placed on a carrier, and a sealing resin layer is formed on the carrier, followed by the carrier being peeled away to be removed, and thereby providing a package precursor in which the first and second electronic components are embedded such that an electrode of at least one of the first and second electronic components is exposed at a surface of the sealing resin layer, wherein, upon the placing of the first and second electronic components, the first and second electronic components are positioned such that their height levels differ from each other, and wherein, after the removal of the carrier, a metal plating layer is formed such that the metal plating layer is in contact with the exposed surface of the electrode of the at least one of the first and second electronic components.

Furthermore, an embodiment of the present invention provides an electronic component package, comprising:

a sealing resin layer;

first and second electronic components buried in the sealing resin layer, an electrode of each of the first and second electronic components being flush with a surface of the sealing resin layer; and metal plating pattern layers "A" and "B", the metal plating pattern layer "A" being in connection with the electrode of the first electronic component, the metal plating pattern layer "B" being in connection with the electrode of the second electronic component, wherein a part of the surface of the sealing resin layer is provided as an indent surface portion, and the electrode of either one of the first and second electronic components is flush with the indent surface portion, and thereby the electrode of the first electronic component and the electrode of the second electronic component are on the different plane levels from each other, and wherein each of the metal plating pattern layers "A" and "B" has a layered structure of a wet plating layer and a dry plating layer, the wet plating layer being located relatively outside, the dry plating layer being located relatively inside.

In accordance with the electronic component package according to an embodiment of the present invention, the metal plating layer is provided so that it is in direct contact with the electronic component, which can achieve the improvement of the heat releasing performance and the connection reliability in the high-density packaging.

BRIEF DESCRIPTION OF THE DRAWINGS

FIG. 2A includes schematic illustrations showing a concept of a manufacturing method of an electronic component package according to an embodiment of the present invention.

FIG. 2B includes schematic illustrations showing a concept of a manufacturing method of an electronic component package according to an embodiment of the present invention.

FIGS. 3A to 3H are process-cross sectional views schematically illustrating a manufacturing method of an electronic component package according to the first embodiment of the present invention.

FIGS. 5A to 5G are process-cross sectional views schematically illustrating a manufacturing method of an electronic component package according to the second embodiment of the present invention.

DETAILED DESCRIPTION OF THE INVENTION

Findings as Basis for Invention

The inventors have found out that the conventional packaging technologies mentioned in the paragraph "BACKGROUND OF THE INVENTION" have the following problems.

Figure 14A:
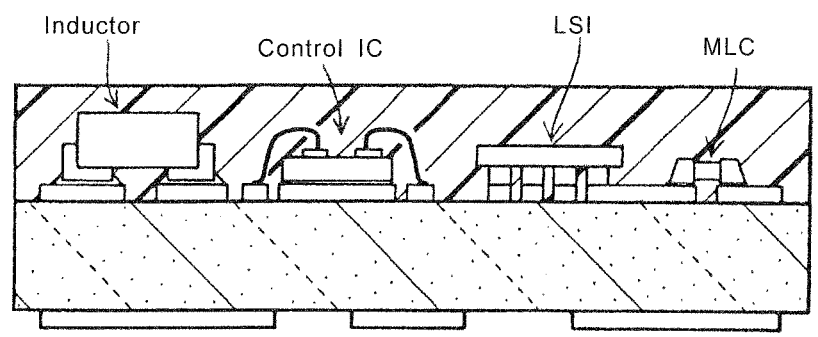
FIGS. 14A and 14B are cross-sectional views schematically illustrating a configurations of an electronic component package of the prior art.

The package technology regarding "package with circuit substrate" (see FIG. 14A) makes it possible to provide a high-density packaging. However, there has been still problem of a heat releasing, the problem being attributed to the presence of the circuit substrate. The cost of the substrate in itself is not negligible, and thus "package with circuit substrate" is not necessarily satisfactory in terms of cost. Furthermore, the cost for a wire bonding or flip-chip mounting is also not negligible, and thus the cost reduction thereof is desired. In this regard, a costly mounter is generally required in the flip-chip mounting.

Figure 14B:
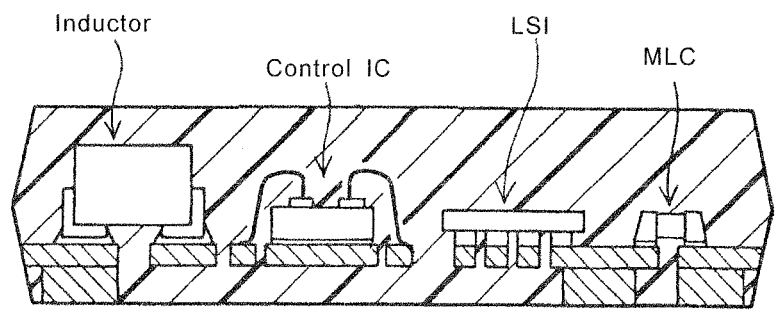

As for the lead frame-type package (see FIG. 14B), the lead frame in itself makes it difficult to provide a fine process. Thus, the lead frame-type package is not appropriate for the high-density packaging. The lead frame-type package as well as the circuit substrate-type package is associated with the soldering, which could raise a concern about so-called "solder flash" upon the whole sealing with resin material. Due to the solder flash, these packages are not necessarily satisfactory in terms of connection reliability. Specifically, there is such a concern that the solder material used for the connection of package components can be re-melted due to the heating of the soldering for module packaging, and thus the re-melted solder material may seeps into the fine interstices (the seeping being referred to "flash"), or may adversely cause a short circuit.

Under the above circumstances, an embodiment of the present invention has been created. In other words, a main object of an embodiment of the present invention is to provide a packaging technology capable of satisfying the desired heat releasing and connection reliability in the high-density packaging.

Rather than addressing as merely extensions of conventional arts, the inventors tried to accomplish the above main object by addressing from a new point of view. As a result, the inventors have created the invention of an electronic component package and a manufacturing method thereof, both of which are capable of achieving the above main object. Specifically, an embodiment of the present invention provides a method for manufacturing an electronic component package, wherein a first electronic component and a second electronic component are placed on a carrier, and a sealing resin layer is formed on the carrier, followed by the carrier being peeled away to be removed, and thereby providing a package precursor in which the first and second electronic components are in an embedded state such that an electrode of at least one of the first and second electronic components is exposed at a surface of the sealing resin layer, wherein, upon the placing of the first and second electronic components, the first and second electronic components are positioned such that their height levels differ from each other, and wherein, after the removal of the carrier, a metal plating layer is formed such that the metal plating layer is in contact with the exposed surface of the electrode of the at least one of the first and second electronic components.

One of the features of the manufacturing method of the electronic component package according to an embodiment of the present invention is that, upon the placing of the first and second electronic components, the first and second electronic components are positioned such that height levels of the first and second electronic components differ from each other, and thereby the electrode of the first electronic component and the electrode of the second electronic component are exposed at the surface of the sealing resin layer such that they are on the different plane levels from each other.

Furthermore, an embodiment of the present invention also provides an electronic component package, comprising:
a sealing resin layer;
first and second electronic components buried in the sealing resin layer, an electrode of each of the first and second electronic components being flush with a surface of the sealing resin layer; and
metal plating pattern layers "A" and "B", the metal plating pattern layer "A" being in connection with the electrode of the first electronic component, the metal plating pattern layer "B" being in connection with the electrode of the second electronic component, wherein a part of the surface of the sealing resin layer is provided as an indent surface portion, and the electrode of either one of the first and second electronic components is flush with the indent surface portion, and thereby the electrode of the first electronic component and the electrode of the second electronic component are on the different plane level from each other, and wherein each of the metal plating pattern layers "A" and "B" has a layered structure of a wet plating layer and a dry plating layer, the wet plating layer being located relatively outside, the dry plating layer being located relatively inside.

One of the features of the electronic component package according to an embodiment of the present invention is that a part of the surface of the sealing resin layer is provided as an indent surface portion, and the electrode of either one of the first and second electronic components is flush with the indent surface portion, and thereby the electrode of the first electronic component and the electrode of the second electronic component are on the different plane level from each other, and that the each of the metal plating pattern layers has the layered structure of the wet plating layer located relatively outside and the dry plating layer located relatively inside.

In accordance with an embodiment of the present invention, the desired heat releasing and connection reliability can be satisfied while achieving the low-cost mounting.

With respect to the "heat-releasing performance" according to an embodiment of the present invention, a mounting with no wire bonding or no bump is provided (that is, there is provided a wire bonding-less/bump-less package), which enables the heat from the electronic component to be released effectively via the metal plating layer, i.e., the metal plating pattern layer. In this regard, the metal plating layer can be made of a material with high thermal conductivity (e.g., copper material), and also can be provided as "metal plating layer having the large thickness". Therefore, an embodiment of the present invention makes it possible to effectively release the heat via the metal plating layer to the outside thereof.

An embodiment of the present invention can also achieve a packaging with no need of "soldering". As a result, the packaging with no soldering material included therein can be achieved. This makes it possible to avoid the unfavorable "solder flash", which leads to an improvement of the connection reliability.

Furthermore, an embodiment of the present invention can produce the metal plating layers with their thicknesses being different from each other in accordance with the electronic component. This makes it possible to achieve not only the provision of the metal plating layer capable of meeting the needs of the high-density mounting, but also the provision of the thick metal plating pattern layer capable of meeting the needs of the suitable heat-releasing performance in the single one package. In other words, with respect to the electronic component where the extremely narrow pitch or the fine patterning is required, the formation of the high-density metal plating pattern layer can be achieved by the smaller thickness of the metal plating layer for the connection portion and the wiring portion. It should be noted that, in general, the fine patterning can be readily achieved if the thickness of the metal is smaller. While on the other hand, with respect to the electronic component where the heat releasing is particularly required in view of the large electric current, the formation of the metal plating pattern layer with an improved heat releasing property can also be achieved by the larger thickness of the metal plating layer.

Furthermore, the package according to an embodiment of the present invention has a "substrate-less structure". The substrate-less structure, i.e., no substrate of the package can contribute to a low-cost manufacturing of the package due to no cost of the substrate. As for such "substrate-less structure", it makes possible to achieve a more simplified packaging process, compared to the wire bonding or flip-chip mounting process, which can also contribute to the low cost manufacturing.

An electronic component package and a manufacturing method thereof according to an embodiment of the present invention will be hereinafter described in more detail. It should be noted that various parts or elements are schematically shown in the drawings wherein their dimensional proportions and their appearances are not necessarily real ones, and are merely illustrated for the purpose of making it easy to understand the present invention.

[Manufacturing Method of the Present Invention]

The manufacturing method of the electronic component package according to an embodiment of the present invention will be firstly described below. The manufacturing method according to an embodiment of the present invention is at least characterized in that, upon the provision of a package precursor using the carrier, the first and second electronic components are positioned with respect to the carrier such that height levels of the first and second electronic components differ from each other.

The package precursor can be provided by the placing of the first and second electronic components onto the carrier, and the subsequent forming of the sealing resin layer on the carrier, followed by the peeling removal of the carrier. In particular, the carrier, which has served as a supporter for the placement of the electronic components and the formation of the sealing resin layer, is eventually peeled away to be removed. The removal of the carrier enables the electrode of the first electronic component and the electrode of the second electronic component to be exposed at the surface of the surface of the sealing resin layer to provide the package precursor (see FIGS. 3, 5 and 7). The manufacturing method according to an embodiment of the present invention has such a feature that the first and second electronic components are positioned upon the placement thereof with respect to the carrier, such that the height levels of the first and second electronic components (e.g., the surface levels of their electrodes regarding the first and second electronic components) are different from each other.

The phrase "the first and second electronic components are positioned such that height levels of the first and second electronic components differ from each other" as used herein means that the first and second electronic components are placed such that the first and second electronic components are not located on the same plane level as each other. In other words, the first and second electronic components are positioned such that their levels differ from each other in the direction of the thickness of the carrier or electronic components. In particular, the first and second electronic components are positioned such that the surface level of the electrode of the first electronic component is different from the surface level of the electrode of the second electronic component in the thickness direction of the carrier or electronic components.

Figure 1:
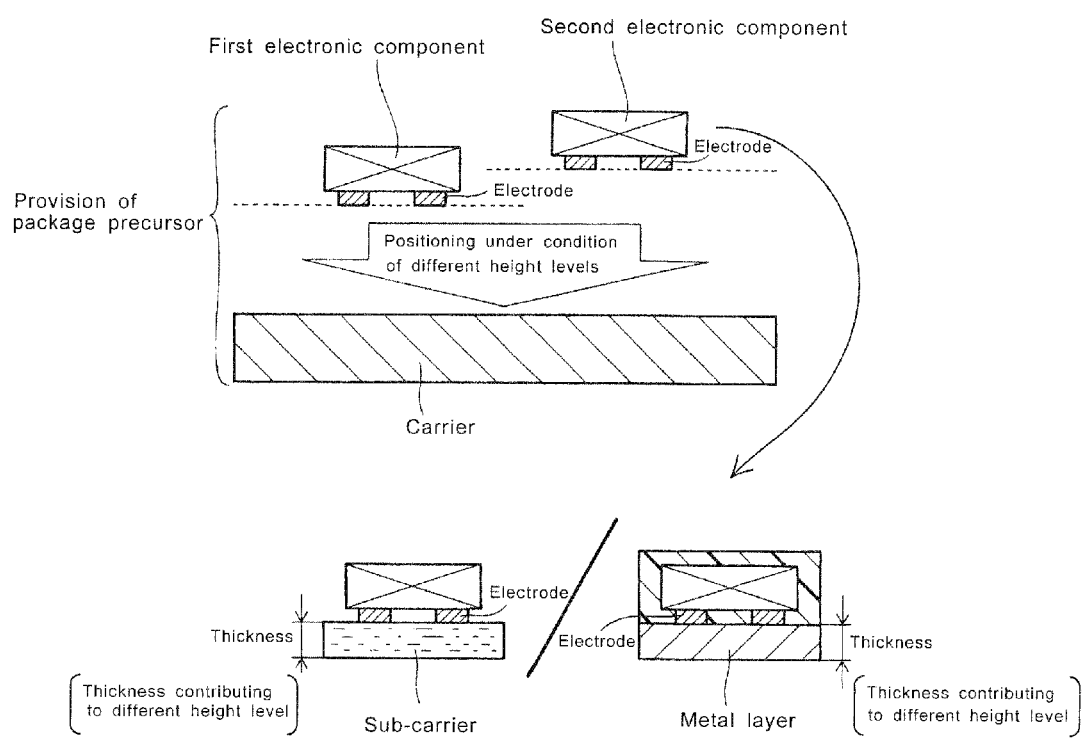
FIG. 1 includes schematic illustrations showing a concept of a manufacturing method of an electronic component package according to an embodiment of the present invention.

In a preferred embodiment, either one or both of the first and second electronic components to be placed on the carrier is an electronic component equipped with a sub-carrier or a metal layer (see the lower illustrations in FIG. 1). Such embodiment enables the height levels of the first and second electronic components to be different from each other due to the sub-carrier or the metal layer. More specifically, as shown in the lower illustrations of FIG. 1, it is preferred that the sub-carrier or the metal layer is preliminarily provided in the first and/or second electronic components such that the sub-carrier or the metal layer is in contact with the electrode(s) of the first and/or second electronic components. Upon the provision of the package precursor, the electronic component (i.e., first and/or second electronic components) is preferably placed on the carrier such that the sub-carrier or the metal layer is located between the electronic component and the carrier. The presence of the sub-carrier or the metal layer enables the first and second electronic components to be positioned at their different height levels from each other. As such, the first electronic component and the second electronic component are located at the different level by the thickness of the sub-carrier or the metal layer.

The term "carrier" as used herein means a part which is used as a supporter for the placement of the electronic component and the formation of the sealing resin layer, and is eventually peeled away for removal thereof. For example, the carrier may be a sheet-like part. The sheet-like part may be adhesive and/or flexible. The term "sub-carrier" as used herein means a carrier which is similar to, but different from the above-described carrier. As such, term "sub-carrier" is referred to a sheet-like part with the size of its principal surface being smaller than that of the carrier.

The term "electrode" as used herein not only means an electrode provided in the first or second electronic component, but also means a metal layer which can eventually compose the electrode. Thus, in a case of a part having a form of a metal layer during the manufacturing of the package, the part can be regarded as "electrode" if the part can eventually serve as an electrode of the electronic component package at the final stage.

In a case where the sub-carrier is used, it is preferred that not only the carrier, but also the sub-carrier is peeled away to be removed. This enables the surface of the sealing resin layer to have an indent surface portion or a stepped portion (see the upper illustration in FIG. 2A). Namely, the removal of the sub-carrier located between the carrier and the electronic component (i.e., first electronic component and/or second electronic component) makes it possible to form the indent surface portion or the stepped portion in the surface of the sealing resin layer, the indent surface portion or the stepped portion being in an exposed state at the surface region of the sealing resin layer. The indent surface portion thus formed has a size attributed to the sub-carrier. In particular, the concave dimension of the indent surface portion (i.e., dimension of stepped portion) can correspond to the thickness dimension of the sub-carrier. In a case of the electronic component equipped with the metal layer, a partial removal of the metal layer enables the surface of the sealing resin layer to have the stepped portion. For example, the partial removal can be performed by an additional formation of a metal plating layer with respect to the metal layer, followed by a partial removal of the metal and metal plating layers. As shown in FIG. 2B, a part of the metal layer is removed to form the stepped portion in the surface of the sealing resin layer, the stepped portion being in an exposed state at the surface region of the sealing resin layer. Similarly to "indent surface portion", the stepped portion thus formed has a size attributed to the metal layer. In particular, the size of the stepped portion can correspond to the thickness dimension of the metal layer.

In the manufacturing method according to an embodiment of the present invention, it is preferred that the peeling removal of the carrier enables the electrode of at least one of the first and second electronic components to be exposed to the outside. It is particularly preferred that the peeling removal of the carrier enables the exposed electrode of at least one of the first and second electronic components to be flush with the surface of the sealing resin layer. Thus, the exposed electrode of the electronic component (i.e., at least one of the first and second electronic components) is preferably such that the surface of the electrode of the electronic component and the surface of the sealing resin layer are on the same plane level as each other. In the case of the use of the sub-carrier, not only the peeling removal of the carrier, but also the peeling removal of the sub-carrier is performed, and thereby the exposed electrode of at least one of the first and second electronic components can be flush with the indent surface portion of the sealing resin layer (see the upper illustration in FIG. 2A). In this regard, the removal of the sub-carrier located between the carrier and the electronic component (i.e., first electronic component and/or second electronic component) makes it possible to form the indent surface portion in the surface of the sealing resin layer such that the exposed electrode of the electronic component is flush with the indent surface portion, for example. This means that, in the case of the use of the sub-carrier, the electrode of the first or second electronic component is exposed at the surface of the sealing resin layer such that a sealing resin layer's surface corresponding to the bottom of the indent surface portion, and the surface of the electrode of the first or second electronic component are positioned on the same plane level as each other.

The peeling removal of the sub-carrier may be performed at the same time when the carrier is peeled away for removal thereof. Thus, the carrier and the sub-carrier are integrally peeled away to be removed. In a case where at least one of the carrier and the sub-carrier is adhesive, the carrier and the sub-carrier can be peeled away to be removed under such a condition that the carrier and the sub-carrier are connected to each other.

In a preferred embodiment of the present invention, a metal plating layer (preferably a metal plating pattern layer) in connection with the electrode of the first electronic component, and also a metal plating layer (preferably a metal plating pattern layer) in connection with the electrode of the second electronic component are formed. In this regard, the different height levels of the first and second electronic components can cause the difference in the layer thickness between the metal plating layer in connection with the electrode of the first electronic component and the metal plating layer in connection with the electrode of the second electronic component. Specifically, as shown in the lower illustrations of FIGS. 2A and 2B, the metal plating layer in connection with the electrode of the first electronic component and the metal plating layer in connection with the electrode of the second electronic component are formed by the metal plating process such that the outer surfaces of respective ones of the metal plating layers are on the same plane level as each other, in which case the thickness of the metal plating layer in connection with the electrode of the first electronic component and the thickness of the metal plating layer in connection with the electrode of the second electronic component are different from each other due to the different height levels of the first and second electronic components. In this case, the difference in the thickness between the metal plating layers can correspond to the concave dimension of the indent surface portion (the dimension of stepped portion, i.e., the thickness dimension of the sub-carrier or metal layer), or the difference in thickness between the sub-carriers.

The manufacturing method of the present invention can be performed in various process embodiments, which will be now described below.

First Embodiment

The process of the manufacturing method according to the first embodiment of the present invention is shown in FIGS. 3A-3H and FIGS. 4A-4C.

The first embodiment of the present invention is characterized in that the manufacturing method comprises the steps of:

(i) placing the first electronic component onto an adhesive carrier used as the carrier;

(ii) providing the second electronic component equipped with an adhesive sub-carrier as the sub-carrier;

(iii) placing the second electronic component equipped with the adhesive sub-carrier onto the adhesive carrier, the placed second electronic component being not overlapped with the placed first electronic component;

(iv) forming the sealing resin layer on the adhesive carrier such that the first and second electronic components are covered with the sealing resin layer, and thereby the precursor of the electronic component package is produced;

(v) peeling away the adhesive carrier and the adhesive sub-carrier from the precursor of the electronic component package, and thereby the electrode of the first electronic component and the electrode of the second electronic component are exposed at the surface of the sealing resin layer; and (vi) forming the metal plating layer such that the metal plating layer is in contact with the exposed surface of the electrode of the first electronic component and the exposed surface of the electrode of the second electronic component, wherein the different height levels of the first and second electronic components from each other is provided in the step (iii) due to the adhesive sub-carrier located between the adhesive carrier and the second electronic component, and wherein the formation of the metal plating layer in the step (vi) is performed by a dry plating process and a subsequent wet plating process.

The first embodiment will now be described in more detail. First, as the step (i), at least one kind of the first electronic component 30 is placed on the adhesive carrier 20 (see FIG. 3A). Namely, the placing of the first electronic component 30 is performed such that the first electronic component 30 is attached to the adhesive carrier 20. Next, the steps (ii) and (iii) are carried out. As shown in FIGS. 3B and 3C, the second electronic component 31 equipped with the adhesive sub-carrier 21 is provided, and thereafter such second electronic component 31 is attached to the adhesive carrier 20. The attaching of the second electronic component 31 equipped with the adhesive sub-carrier is performed such that the first electronic component 30 and the second electronic component 31 are not overlapped with each other. In particular, the second electronic component 31 equipped with the adhesive sub-carrier 21 is preferably placed under such a condition that the adhesive sub-carrier 21 is located between the adhesive carrier 20 and the second electronic component 31.

Each of the adhesive carrier 20 and the adhesive sub-carrier 21 may be a carrier sheet which is suitably composed of a base and an adhesive layer, for example. As shown in FIG. 3A, the carrier sheet having a two-layered structure in which the adhesive layer 26 is provided on a supporting base 24 may be used. In terms of a suitable peeling of the adhesive carrier or sub-carrier (the peeling being later performed), it is preferred that the supporting base 24 is flexible.

The supporting base 24 of the carrier sheet may be any suitable sheet-like part as long as it cannot adversely affect "disposing/placing of electronic component" or "formation of sealing resin layer". For example, the material for the supporting base 24 may be a resin, a metal and/or a ceramic. Examples of the resin may include polyester resin (e.g., polyethylene terephthalate, polyethylene naphthalate), acrylic resin (e.g., polymethylmethacrylate), polycycloolefin and polycarbonate. Examples of the metal for the supporting base 24 may include iron, copper, aluminium and alloy thereof. By way of example, the metal may be a stainless material (e.g., SUS). Examples of the ceramic for the supporting base 24 may include apatite, alumina, silica, silicon carbide, silicon nitride, and boron carbide. The thickness of the supporting base is preferably in the range of 0.1 mm to 2.0 mm, more preferably in the range of 0.2 mm to 1.0 mm (for example, 0.2 mm), because of the "sheet-like" form of the adhesive carrier or sub-carrier.

While on the other hand, the adhesive layer 26 may be any suitable one as long as it has an adhesive property with respect to the electronic component. For example, the adhesive layer may comprise at least one kind of adhesive material selected from the group consisting of acrylic resin-based adhesive, urethane resin-based adhesive, silicone resin-based adhesive and epoxy resin adhesive. The thickness of the adhesive layer 26 is preferably in the range of 2 µm to 100 µm, more preferably in the range of 5 µm to 20 µm (for example, 10 µm). As the adhesive layer 26, a double-faced adhesive tape may be used. In this regard, the double faced tape wherein an adhesive layer is provided on both principal surfaces of a resin film layer (e.g., PET film) may be used, for example. In view of suitable formation of the stepped portion in the sealing resin layer's surface at which the electrode (30,31) is exposed by the peeling removal of the sub-carrier, the adhesive layer 26 of the adhesive carrier 20 preferably has a stronger adhesion than that of the sub-adhesive carrier 21. The sub-adhesive carrier 21 may be substantially a single layer of the adhesive layer 26, as shown in FIG. 3B.

Each of the first electronic component 30 and the second electronic component 31 may be any suitable one as long as it is a circuit component/element used in the electronics packaging field. Examples of the electronic component may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like.

As shown in FIG. 3A, the placing of the first electronic component 30 is preferably such that the electrode 35 thereof makes contact with the adhesive carrier 20. This enables the electrode 35 of the electronic component 30 to be suitably exposed at a later step for the peeling removal of the adhesive carrier 20. As for the second electronic component 31 equipped with the adhesive sub-carrier 21, it is preferred that the electrode 36 of the second electronic component is in contact with the sub-carrier 21. This enables the electrode 36 of the electronic component 31 to be suitably exposed at a later step for the peeling removal of the adhesive sub-carrier 21.

At a point in time after the placing step (iii) of the second electronic component, the height level of the first electronic component 30 and the height level of the second electronic component 31 are different from each other, as shown in FIG. 3C. As seen from the illustration of FIG. 3C, the height levels of the first and second electronic components 30, 31 are different from each other due to the adhesive sub-carrier 21 located between the second electronic component 31 and the adhesive carrier 20. In particular, the second electronic component 31 is positioned at higher height level than the first electronic component 30.

Subsequent to the steps (ii) and (iii), the step (iv) is carried out. Namely, as shown in FIG. 3D, the sealing resin layer 40 is formed on the adhesive carrier 20 such that the electronic components 30, 31 are covered with the sealing resin layer 40. This results in a production of a precursor 100' of the electronic component package. The formation of the sealing resin layer 40 can be performed by applying a resin material onto an adhesive surface of the adhesive carrier 20 by a spin-coating process or a doctor-blade process, followed by being subjected to a heat treatment or a light-exposure treatment. In other words, the sealing resin layer 40 can be provided by subjecting the applied resin material to a heat or light curing treatment. Alternatively, the sealing resin layer 40 may be provided by putting a resin film on the adhesive surface of the adhesive carrier 20. Furthermore, the sealing resin layer 40 may be provided by filling an uncured powdered or liquid resin into a die, followed by a heat curing thereof.

The material for the sealing resin layer 40 may be any suitable one as long as it exhibits an electrical insulation property. For example, the material of the sealing resin layer may be an epoxy-based resin or a silicone-based resin. The thickness of the sealing resin layer 40 is preferably in the approximate range of 0.5 mm to 5.0 mm, and more preferably in the approximate range of 1.2 mm to 1.8 mm.

Subsequent to the step (iv), the step (v) is carried out. Namely, as shown in FIG. 3E, the adhesive carrier 20 and the adhesive sub-carrier 21 are peeled away from the precursor 100' of the electronic component package, and thereby the electrode 35 of the first electronic component 30 and the electrode 36 of the second electronic component 31 are exposed at the surface of the sealing resin layer 40.

The peeling removal of the adhesive sub-carrier 21 located between the second electronic component 31 and the adhesive carrier 20 enables the surface of the sealing resin layer to be provided with the indent surface portion 45. In other words, the adhesive sub-carrier 21 is peeled away to be removed, and thereby the indent surface portion 45 is exposed. As seen from the illustration in FIG. 3E, the indent surface portion 45 has a size attributed to the adhesive sub-carrier 21. In particular, the concave dimension of the indent surface portion 45 (i.e., dimension of stepped portion) can correspond to the thickness dimension of the adhesive sub-carrier 21.

In the peeling removal step (v), the electrode 35 of the first electronic component 30 and the electrode 36 of the second electronic component 31 are preferably exposed at the surface of the sealing resin layer such that the electrodes 35, 36 are flush with the surface of the sealing resin layer. In particular, the second electronic component 31, which is associated with the adhesive sub-carrier 21, is exposed at the indent surface portion 45 of the sealing resin layer such that the electrode 36 of the second electronic component is flush with the indent surface portion 45. As such, the electrode 35 of the first electronic component 30 is exposed at non-indent surface portion (i.e., sealing resin surface other than the indent surface portion 45) such that the electrode 35 is flush with the non-indent surface portion, whereas the electrode 36 of the second electronic component 31 is exposed at the indent surface portion 45 such that the electrode 36 is flush with the indent surface portion 45. Especially as for the second electronic component 31, the electrode 36 thereof is preferably exposed at the sealing resin layer 40 such that the electrode surface of the second electronic component 31 and the bottom surface of the indent surface portion 45 are substantially on the same plane level as each other.

According to the embodiment of the present invention, the presence of the adhesive sub-carrier 21 makes it possible to not only form the indent portion in the surface of the sealing resin layer 40, but also create a stepped form regarding the exposed surfaces of the first and second electronic components 30, 31. More specifically, the presence of the adhesive sub-carrier 21, which is locally located between the second electronic component 31 and the adhesive carrier 20 at the bonding surface between the electronic components (30, 31)/sealing resin layer 40 and the adhesive carrier, can create the stepped form between exposed surfaces 40A and 40B of the sealing resin layer 40, and thereby the exposed surface of the first electronic component 30 (especially the exposed surface of the electrode thereof) and the exposed surface of the second electronic component 31 (especially the exposed surface of the electrode thereof) are on the different plane levels from each other (see the right-sided illustration of FIG. 3E). This is due to such a configuration of the package precursor that the first electronic component 30 and a surrounding portion of the sealing resin layer are in contact with a contact surface "a" of the adhesive carrier 20, whereas the second electronic component 31 and a surrounding portion of the sealing resin layer are in contact with a contact surface "b" of the adhesive sub-carrier 21 located on the adhesive carrier 20 (see the right-sided illustration of FIG. 3D). While the first electronic component 30 and exposure surface 40A of the sealing resin layer are on the same plane level as each other, and also the second electronic component 31 and exposure surface 40B of the sealing resin layer are on the same plane level as each other, the first and second electronic component 30, 31 are on the different height levels from each other as a whole by the thickness dimension of the adhesive sub-carrier 21.

The stepped form regarding the electronic components and the exposure surface of the sealing resin layer can be effectively provided due to the thickness of the adhesive sub-carrier, and thereby the exposed surface of the first electronic component 30 (especially, the exposed surface of the electrode 35 thereof) and the exposed surface of the second electronic component 31 (especially, the exposed surface of the electrode 36 thereof) can be exposed at different plane levels from each other. This means that the stepped form between the exposed surface of the first electronic component 30 (especially, the exposed surface of the electrode thereof) and the exposed surface of the second electronic component 31 (especially, the exposed surface of the electrode thereof) can be controlled by the thickness of the adhesive sub-carrier. For example, in a case where the thickness of the adhesive sub-carrier is in the range of 2 μm to 100 μm, preferably in the range of 5 μm to 100 μm (e.g., about 50 μm), the dimension of the stepped portion between the exposed surface of the first electronic component 30 (especially, the exposed surface of the electrode thereof) and the exposed surface of the second electronic component 31 (especially, the exposed surface of the electrode thereof) can be in the range of 2 μm to 100 μm, preferably in the range of 5 μm to 100 μm (e.g., about 50 μm).

Subsequent to the step (v), the step (vi) is carried out. Namely, the metal plating layer is formed such that it is in contact with the exposure surface of the sealing resin layer and the exposed surface of the electrodes of the electronic components. It is preferred in the step (vi) that a dry plating process is performed with respect to the exposure surface of the sealing resin layer and the exposed surfaces of the electrodes of the electronic components (see FIG. 3F), and thereafter a wet plating process is performed (see FIG. 3G) to form the metal plating layer 50. Such step (vi) has such a process feature that a metal layer is directly provided with respect to the exposure surface of the sealing resin layer and the exposed surfaces of the electrodes of the electronic components. The metal plating layer 50 can be provided as a thick layer, and thus it can serve as "heat-releasing part".

Particularly when focusing on the manufacturing processes, due to the dry plating process, the plating layer with being thick and having good adhesion can be formed by the subsequent wet plating process.

Examples of the dry plating process include a vacuum plating process (Physical Vapor Deposition, i.e., PVD process) and a chemical vapor plating process (Chemical Vapor Deposition, i.e., CVD process). Examples of the vacuum plating process include a sputtering process, a vacuum deposition process, and an ion plating process. On the other hand, examples of the wet plating process include an electroplating process (e.g., electrolytic plating process), a chemical plating process, and a hot-dip plating process. In a preferred embodiment of the manufacturing method of the present invention, the sputtering may be performed as the dry plating process, whereas the electroplating (e.g., electrolytic plating) may be performed as the wet plating process.

The first electronic component 30 and the second electronic component 31 are on the different plane levels from each other. In this regard, a filling plating process may be performed so that the outermost layers of the metal plating layer 50, which are in connection with the first and second electronic components, are on the same plane levels as each other. Furthermore, at a point in time after the suitable wet plating process, a polishing process may be additionally performed so as to polish the outermost layer of the wet plating layer 50. Example of the polishing process may include a CMP polishing, a tape polishing, a dry polishing, a grinding, a lap polishing, and the like.

It is preferred in the step (vi) that a dry plating layer 50' with its thickness of 100 nm to 1000 nm is formed by the dry plating process (see FIG. 3F), and thereafter the wet plating layer 50" with its thickness of 5 μm to 500 μm is formed by the wet plating process (see FIG. 3G). Namely, the dry plating layer 50' is provided in the very thin form, whereas the wet plating layer 50" is provided in the thick form, which leads to a large thickness of the metal plating layer 50 as a whole.

The first metal plating layer 50' formed by the dry plating process preferably comprises at least one kind of metal material selected from the group consisting of Ti (titanium), Cr (chromium) and Ni (nickel). While on the other hand, the wet plating layer 50" formed by the wet plating process preferably comprises at least one kind of metal material selected from the group consisting of Cu (copper), Ni (nickel) and Al (aluminum).

By way of example, the dry plating layer 50' is not limited to a single layer, but may be formed as a form of multiple layers. For example, a Ti thin film layer and a Cu thin film layer may be formed as the dry plating layer 50' by the sputtering process. More specifically, the formation of the Ti thin film layer is performed, followed by the formation of the Cu thin film layer, the both formations being performed by the sputtering process. On such sputtering layers having the two-layers structure, it is preferable to form the thick plating copper layer 50" by the electrolytic plating process.

Preferably, the metal plating layer 50 formed by the dry and wet plating processes is subjected to a patterning treatment. Specifically, as shown in FIG. 3H, the patterning treatment of the metal plating layer 50 is preferably performed so as to form the metal plating pattern layers "A" 50A and "B" 50B therefrom, the metal plating pattern layer "A" 50A being in contact with the exposed surface of the electrode of the first electronic component 30, the metal plating pattern layer "B" 50B being in contact with the exposed surface of the electrode of the second electronic component 31. The patterning treatment leads to a desired wiring formation, e.g., a desired pattern formation of wirings including an extraction electrode. The patterning in itself is not particularly limited as long as it is used in the electronics packaging field. For example, a photolithography process can be available for the patterning, in which case a formation of resist layer, an exposure to the light and subsequent development, and an etching are sequentially performed.

According to an embodiment of the present invention, the presence of the second adhesive carrier 21 enables the first and second electronic components 30, 31 to be exposed at the surface of the sealing resin layer under the condition of their different plane levels from each other. Due to this, the metal plating pattern layer "A" 50A and the metal plating pattern layer "B" 50B are provided as different-thickness plating pattern layers with their thicknesses being different from each other (see the right-sided illustration of FIG. 3H). In particular, the thickness of the metal plating pattern layer "B" 50B can be larger than that of the metal plating pattern layer "A" 50A, and thus the metal plating pattern layer "B" 50B can suitably serve as a more effective heat-releasing part. While on the other hand, the metal plating pattern layer "A" 50A, which is thinner than the metal plating pattern layer "B" 50B, can suitably serve as a higher-density mounting part such as a narrow pitch connection, a fine wiring and the like.

The outermost layers of the metal plating pattern layers "A" 50A and "B" 50B, which are relatively located at the side of outermost, can be on the same plane level as each other. This can be appropriate for the formation of the resist layer and the mounting of the electronic package with respect to a substrate at a later stage.

In addition to the formations of the metal plating pattern layers "A" 50A and "B" 50B in contact with the exposed surfaces of the electrodes of the electronic components, a further metal plating pattern layer may be formed, the further layer being in no contact with both of "exposed surface of the electrode of the first electronic component 30" and "exposed surface of the electrode of the second electronic component 31". The further metal plating pattern layer enables the heat to be directly released therethrough, in addition to or instead of through the surfaces of the sealing resin and electrodes of the electronic components.

Figure 4A:
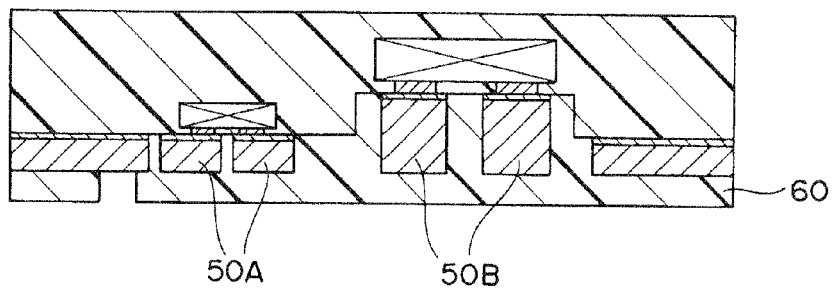
FIGS. 4A to 4C are process-cross sectional views schematically illustrating a manufacturing method of an electronic component package according to the first embodiment of the present invention.

Subsequent to the patterning treatment of the metal plating layer, a resist layer is preferably formed with respect to the metal plating pattern layer. For example, it is preferred as shown in FIG. 4A that a solder resist layer 60 is formed on the surface of the sealing resin layer (the surface being an exposed surface due to the peeling of the adhesive carrier) such that the metal plating pattern layers "A" 50A and "B" 50B are partially covered with the resist layer. The formation of the resist layer 60 may be the same as that generally used in the electronics packaging field.

Figure 4B:
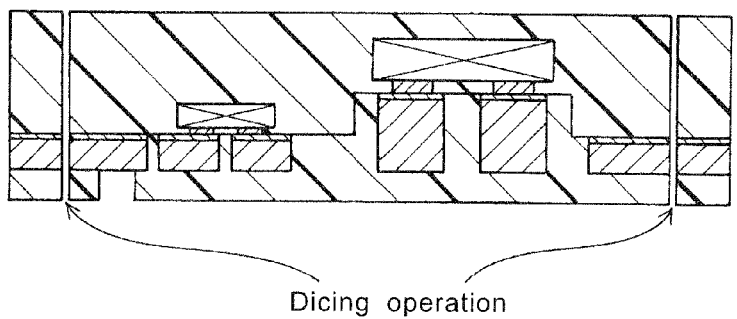
Figure 4C:
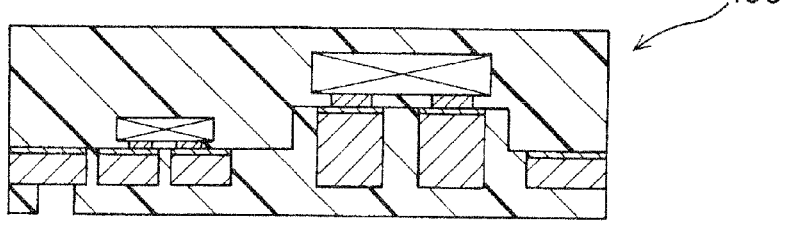

Through the above steps (with an additional step of the dicing operation as shown in FIG. 4B, for example), there can be finally obtained an electronic component package 100 as shown in FIG. 4C.

Second Embodiment

The process of the manufacturing method according to the second embodiment of the present invention is shown in FIGS. 5A-5G.

The second embodiment of the present invention is characterized in that the manufacturing method comprises the steps of:

(i)' providing the first electronic component equipped with a first adhesive sub-carrier used as the sub-carrier;

(ii)' providing the second electronic component equipped with a second adhesive sub-carrier used as the sub-carrier;

(iii)' placing the first electronic component equipped with the first adhesive sub-carrier and the second electronic component equipped with the second adhesive sub-carrier on a supporting substrate (i.e., carrier), the placed first and second electronic components being not overlapped with each other;

(iv)' forming the sealing resin layer on the supporting substrate such that the first and second electronic components are covered with the sealing resin layer, and thereby the precursor of the electronic component package is produced;

(v)' peeling away the supporting substrate, the first adhesive sub-carrier and the second adhesive sub-carrier from the precursor of the electronic component package, and thereby the electrode of the first electronic component and the electrode of the second electronic component are exposed at the surface of the sealing resin layer; and (vi)' forming the metal plating layer such that the metal plating layer is in contact with the exposed surface of the electrode of the first electronic component and the exposed surface of the electrode of the second electronic component, wherein the different height levels of the first and second electronic components from each other is provided in the step (iii)' due to the first adhesive sub-carrier located between the supporting substrate and the first electronic component and the second adhesive sub-carrier located between the supporting substrate and the second electronic component, and wherein the formation of the metal plating layer in the step (vi)' is performed by a dry plating process and a subsequent wet plating process.

The second embodiment will now be described specifically wherein the description for items overlapping the first embodiment will be omitted. First, as the steps (i)' and (ii)', the first electronic component 30 equipped with the first adhesive sub-carrier 21A used as the sub-carrier is provided, and also the second electronic component 31 equipped with the second adhesive sub-carrier 21B used as the sub-carrier is provided. As shown in FIG. 5A, it is preferred that the electrode 35 of the first electronic component 30 is in contact with the first adhesive sub-carrier 21A, and also the electrode 36 of the second electronic component 31 is in contact with the second adhesive sub-carrier 21B. This enables the electrode 35 of the first electronic component 30 and the electrode 36 of the second electronic component 31 to be suitably exposed at a later peeling step of the adhesive sub-carriers.

Subsequent to the steps (i)' and (ii)', the step (iii)' is carried out. Namely, as shown in FIGS. 5A and 5B, the first electronic component 30 equipped with the first adhesive sub-carrier 21A and the second electronic component 31 equipped with the second adhesive sub-carrier 21A are placed onto the supporting substrate 28 such that the placed first and second electronic components 30, 31 are not overlapped with each other.

At a point in time after the placing step (iii)' of the electronic components, the height level of the first electronic component 30 and the height level of the second electronic component 31 are different from each other, as shown in FIG. 5B. As seen from the illustration of FIG. 5B, the height levels of the first and second electronic components 30, 31 are different from each other due to "first adhesive sub-carrier 21A located between the first electronic component 30 and the adhesive carrier 20" and "second adhesive sub-carrier 21B located between the second electronic component 31 and the adhesive carrier 20". In particular, the height levels of the first and second electronic components 30, 31 are different from each other due to the difference in the sub-carrier thickness between the first adhesive sub-carrier 21A and the second adhesive sub-carrier 21B.

The supporting substrate 28 used as the carrier may be any suitable sheet-like part as long as it cannot adversely affect "disposing/placing of electronic components" or "formation of sealing resin layer". In terms of a suitable peeling of the supporting substrate (the peeling being later performed), it is preferred that the supporting substrate 28 is flexible. For example, the material for the supporting substrate 28 may be a resin, a metal and/or a ceramic. Examples of the resin for supporting substrate 28 may include polyester resin (e.g., polyethylene terephthalate, polyethylene naphthalate), acrylic resin (e.g., polymethylmethacrylate), polycycloolefin and polycarbonate. Examples of the metal for the supporting substrate 28 may include iron, copper, aluminium and alloy thereof. By way of example, the metal may be a stainless material (e.g., SUS). Examples of the ceramic for the supporting substrate 28 may include apatite, alumina, silica, silicon carbide, silicon nitride, and boron carbide. The thickness of the supporting substrate is preferably in the range of 0.1 mm to 2.0 mm, more preferably in the range of 0.2 mm to 1.0 mm (for example, 0.2 mm), because of the "sheet-like" form of the supporting substrate. The supporting substrate 28 may be a carrier sheet in which an adhesive layer is provided on a supporting base. In this regard, the carrier sheet as described with respect to the first embodiment may be used as the supporting substrate 28. That is, the carrier sheet having a two-layered structure in which the adhesive layer 26 is provided on the supporting base 24 may be used. As for the first adhesive sub-carrier 21A and the second adhesive sub-carrier 21B, it is preferred that they have weaker adhesion than the adhesive layer 26 provided on the supporting base 24. The reason for this is that the adhesive sub-carriers 21A, 21B can be readily peeled away to be removed under such a condition that the adhesive sub-carriers 21A, 21B and the adhesive layer 26 are in connection with each other.

Subsequent to the step (iii)', the step (iv)' is carried out. Namely, as shown in FIG. 5C, the sealing resin layer 40 is formed on the supporting substrate 28 such that the first and second electronic components 30, 31 are covered with the sealing resin layer 40. This results in a production of a precursor 100' of the electronic component package. More specifically, the formation of the sealing resin layer 40 is performed such that the first electronic component 30 provided with respect to the supporting substrate 28 via the first adhesive sub-carrier 21A and the second electronic component 31 provided with respect to the supporting substrate 28 via the second adhesive sub-carrier 21B are covered with the sealing resin layer 40, and thereby the precursor 100' of the electronic component package is provided.

Subsequent to the step (iv)', the step (v)' is carried out. Namely, as shown in FIG. 5D, the supporting substrate 28, the first adhesive sub-carrier 21A and the second adhesive sub-carrier 21B are peeled away from the precursor 100' of the electronic component package, and thereby the electrode 35 of the first electronic component 30 and the electrode 36 of the second electronic component 31 are exposed at the surface of the sealing resin layer 40.

The peeling removal of "first adhesive sub-carrier 21A located between the first electronic component 30 and the supporting substrate 28" and "second adhesive sub-carrier 21B located between the second electronic component 31 and the supporting substrate 28" enables the surface of the sealing resin layer 40 to be provided with the indent surface portions 45A and 45B. In other words, the first and second adhesive sub-carriers 21A and 21B are peeled away to be removed, and thereby the indent surface portions 45A and 45B are exposed. As seen from the illustration in FIG. 5D, the indent surface portion 45A has a size attributed to the first adhesive sub-carrier 21A, and the indent surface portion 45B has a size attributed to the second adhesive sub-carrier 21B. In particular, the concave dimension of the indent surface portion 45A (i.e., dimension of stepped portion) can correspond to the thickness dimension of the first adhesive sub-carrier 21A, and also the concave dimension of the indent surface portion 45B (i.e., dimension of stepped portion) can correspond to the thickness dimension of the second adhesive sub-carrier 21B.

In the peeling removal step (v)', the electrode 35 of the first electronic component 30 and the electrode 36 of the second electronic component 31 are preferably exposed at the surface of the sealing resin layer such that the electrodes 35, 36 are flush with the surface of the sealing resin layer. In particular, the first electronic component 30, which is associated with the first adhesive sub-carrier 21A, is exposed at the indent surface portion 45A of the sealing resin layer such that the electrode 35 of the first electronic component is flush with the indent surface portion 45A. Similarly, the second electronic component 31, which is associated with the second adhesive sub-carrier 21B, is exposed at the indent surface portion 45B of the sealing resin layer such that the electrode 36 of the second electronic component is flush with the indent surface portion 45B. As for the first electronic component 30, the electrode 35 thereof is preferably exposed at the sealing resin layer such that the electrode surface of the first electronic component 30 and the bottom surface of the indent surface portion 45A are substantially on the same plane level as each other. As for the second electronic component 31, the electrode 36 thereof is preferably exposed at the sealing resin layer such that the electrode surface of the second electronic component 31 and the bottom surface of the indent surface portion 45B are substantially on the same plane level as each other.

According to the embodiment of the present invention, the presence of the first and second adhesive sub-carriers 21A, 21B makes it possible to not only form the indent portion in the surface of the sealing resin layer, but also create a stepped form regarding the exposed surfaces of the first and second electronic components 30, 31. More specifically, the presence of the first adhesive sub-carrier 21A, which is locally located between the first electronic component 30 and the supporting substrate 28 at the bonding surface between the electronic components (30, 31)/sealing resin layer 40 and the supporting substrate, can create the stepped form. Similarly, the presence of the second adhesive sub-carrier 21B, which is locally located between the second electronic component 31 and the supporting substrate 28 at the bonding surface between the electronic components (30, 31)/sealing resin layer 40 and the supporting substrate, can also create the stepped form. At the sealing resin layer having the stepped forms, the electrode 35 of the first electronic component 30 and the electrode 36 of the second electronic component 31 are respectively exposed, and thereby the exposed surface of the first electronic component 30 (especially the exposed surface of the electrode thereof) and the exposed surface of the second electronic component 31 (especially the exposed surface of the electrode thereof) are on the different plane levels from each other (see right-sided illustration of FIG. 5D). While the first and second electronic components 30, 31 and exposure surface of the sealing resin layer are on the same plane level as each other, the first and second electronic component 30, 31 are on the different height levels from each other as a whole by the difference in the thickness dimension between the first and second adhesive sub-carrier 21A and 21B. The stepped form regarding the electronic components and the exposure surface of the sealing resin layer can be effectively provided due to the thickness of the adhesive sub-carrier, and thereby the exposed surface of the first electronic component 30 (especially, the exposed surface of the electrode 35 thereof) and the exposed surface of the second electronic component 31 (especially, the exposed surface of the electrode 36 thereof) can be exposed at different plane levels from each other. The difference in the thickness dimension between the first adhesive sub-carrier 21A and the second adhesive sub-carrier 21B may be in the approximate range of 2 μm to 100 μm (e.g., about 50 μm).

Subsequent to the step (v)', the step (vi)' is carried out. Namely, the metal plating layer is formed such that it is in contact with the exposed surfaces of the electrodes of the first and second electronic components. In the step (vi)', a dry plating process is performed with respect to the exposure surface of the sealing resin layer and the exposed surfaces of the electrodes of the electronic components (see FIG. 5E), and thereafter a wet plating process is performed (see FIG. 5F) to form the metal plating layer 50. Similarly to the first embodiment, Such step (vi)' has such a process feature that a metal layer is directly provided with respect to the exposure surface of the sealing resin layer and the exposed surfaces of the electrodes of the electronic components. The metal plating layer 50 can be provided as a thick layer, and thus it can serve as "heat-releasing part". Particularly when focusing on the manufacturing processes, due to the dry plating process, the plating layer with being thick and having good adhesion can be formed by the subsequent wet plating process. According to the second embodiment of the present invention, the presence of the first and second adhesive sub-carriers 21A, 21B enables the first and second electronic components 30, 31 to be exposed at the surface of the sealing resin layer under the condition of the different plane levels from each other. Due to this, the metal plating pattern layer "A" 50A and the metal plating pattern layer "B" 50B are provided as different-thickness plating pattern layers with their thicknesses being different from each other. In particular, the thickness of the metal plating pattern layer "B" 50B can be larger than that of the metal plating pattern layer "A" 50A, and thus the metal plating pattern layer "B" 50B can suitably serve as a more effective heat-releasing part. While on the other hand, the metal plating pattern layer "A" 50A, which is thinner than the metal plating pattern layer "B" 50B, can suitably serve as a higher-density mounting part such as a narrow pitch connection, a fine wiring and the like.

Figure 6:
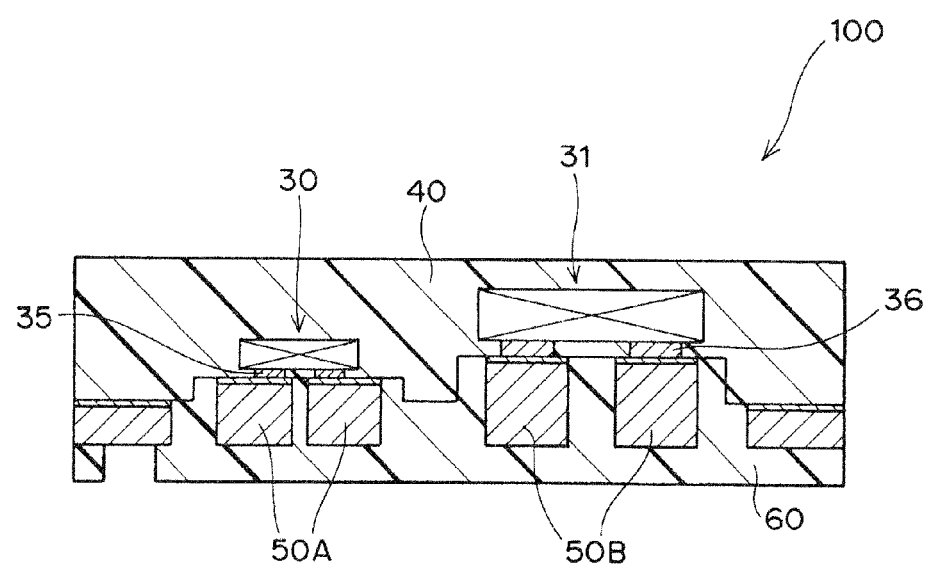
FIG. 6 is a cross-sectional view schematically illustrating a configuration of an electronic component package obtained by the manufacturing method according to the second embodiment of the present invention.

Through the above steps (with an additional steps of the formation of the solder resist layer and the dicing operation for example, similarly to the first embodiment), there can be finally obtained an electronic component package 100 as shown in FIG. 6.

Third Embodiment

The process of the manufacturing method according to the third embodiment of the present invention is shown in FIGS. 7A-7H.

The second embodiment of the present invention is characterized in that the manufacturing method comprises the steps of:

(i)" placing the first electronic component onto an adhesive carrier used as the carrier;

(ii)" providing the second electronic component equipped with the metal layer;

(iii)" placing the second electronic component equipped with the metal layer onto the adhesive carrier, the placed second electronic component being not overlapped with the placed first electronic component;

(iv)" forming the sealing resin layer on the adhesive carrier such that the first and second electronic components are covered with the sealing resin layer, and thereby the precursor of the electronic component package is produced;

(v)" peeling away the adhesive carrier from the precursor of the electronic component package, and thereby the electrode of at least one of the first and second electronic components is exposed at the surface of the sealing resin layer; and (vi)" forming the metal plating layer such that the metal plating layer is in contact with the exposed surface of the electrode of the at least one of the first and second electronic components, wherein the different height levels of the first and second electronic components from each other is provided in the step (iii)" due to the metal layer located between the adhesive carrier and the second electronic component, and wherein the formation of the metal plating layer in the step (vi)" is performed by a dry plating process and a subsequent wet plating process.

Figure 7A:
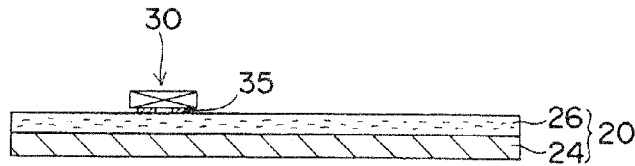
FIGS. 7A to 7H are process-cross sectional views schematically illustrating a manufacturing method of an electronic component package according to the third embodiment of the present invention.

The third embodiment will now be described specifically wherein the description for items overlapping the first and second embodiments will be omitted. First, as the step (i)", the first electronic component 30 is placed onto the adhesive carrier, as shown in FIG. 7A. Namely, the placing of the first electronic component 30 is performed such as the first electronic component 30 is attached to the adhesive carrier 20.

Figure 7B:

Next, as the step (ii)", the second electronic component 31 equipped with the metal layer 10, as shown in FIG. 7B. Namely, there is provided the second electronic component 31 with the metal layer 10 formed therein such that the electrode 36 of the component 31 and the metal layer 10 are in connection with each other.

For example, the metal layer 10 for the second electronic component 31 comprises a metal material selected from the group consisting of copper (Cu), aluminum (Al), silver (Ag), palladium (Pd), platinum (Pt) and nickel (Ni). Preferably, the metal layer 10 is one which can eventually compose the electrode. The thickness of the metal layer 10 is preferably in the range of 2 μm to 100 μm, more preferably in the range of 10 μm to 100 μm (for example, 50 μm). The formation of the metal layer 10 is not particularly limited as long as it is performed in electronics mounting field. For the formation of the metal layer 10, a plating process, or printing process may be performed. As for the plating process, the dry and wet plating processes may be performed to form the metal layer, similarly to the plating process described with respect to the first and second embodiments of the present invention. Namely, the sputtering process may be performed as the dry plating process, and thereafter the electroplating may be performed as the wet plating process. See FIGS. 3F and 3G. This means that the metal layer 10 may be provided as a metal plating layer. Alternatively, as shown in FIGS. 3F and 3G, the metal layer 10 may be formed on such an electronic component-sealing body that the electronic component 31 is preliminarily sealed with the resin, and the electrode 35 thereof is exposed at the resin. The metal layer 10 may be subjected to a patterning process to form a wiring layer in contact with the exposed surface of the electrode of the second electronic component. That is, there may be provided the second electronic component 31 equipped with the wiring layer. The patterning of the metal layer 10 in itself is not particularly limited as long as it is used in the electronics packaging field. For example, a photolithography process can be available for the patterning, in which case a formation of resist layer, an exposure to the light and subsequent development, and an etching are sequentially performed.

Figure 7C:
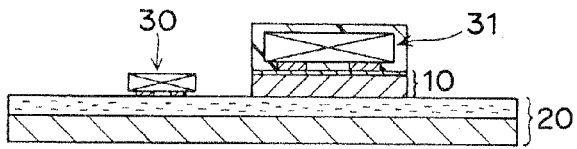

Subsequent to the step (ii)", the step (iii)" is carried out. Namely, as shown in FIG. 7C, the second electronic component 31 equipped with the metal layer 10 onto the adhesive carrier 20 such that the placed second electronic component 31 is not overlapped with the placed first electronic component 30. That is, the second electronic component 31 with metal layer 10 included therein is attached to the adhesive carrier 20 such that the first and second electronic components 30, 31 are not overlapped with each other.

At a point in time after the placing step (iii)" of the second electronic component, the height level of the first electronic component 30 and the height level of the second electronic component 31 are different from each other, as shown in FIG. 7C. As seen from the illustration of FIG. 7C, the height levels of the first and second electronic components 30, 31 are different from each other due to the metal layer 10 located between the second electronic component 31 and the adhesive carrier 20. In particular, the second electronic component 31 is positioned at higher height level than the first electronic component 30.

Figure 7D:
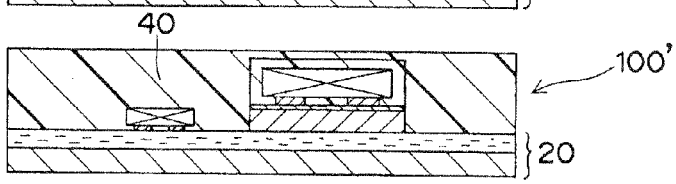
Figure 7E:
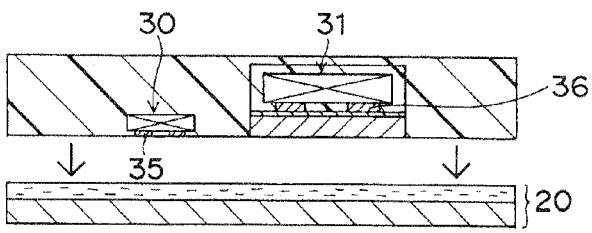
Figure 7F:
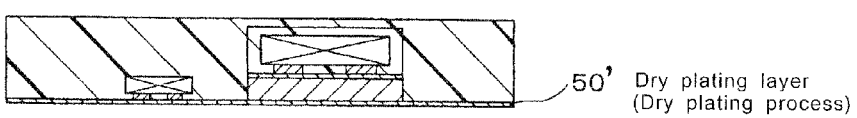
Figure 7G:
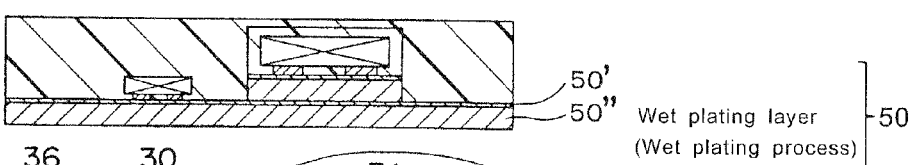

Subsequent to the step (iii)", the step (iv)" is carried out. Namely, as shown in FIG. 7D, the sealing resin layer 40 is formed on the adhesive carrier 20 such that the first and second electronic components 30, 31 are covered with the sealing resin layer 40, and thereby a precursor 100' of the electronic component package is produced.

Subsequent to the step (iv)", the step (v)" is carried out. Namely, as shown in FIG. 7D, the adhesive carrier is peeled away from the precursor of the electronic component package, and thereby the electrode of at least one of the first and second electronic components is exposed at the surface of the sealing resin layer.

The metal layer 10 is one which can eventually compose the electrode, and thus it can be regarded as "electrode". As such, the step (v)", i.e., the peeling removal of the adhesive carrier 20 from the precursor 100' of the electronic component package enables the electrode 35 of the first electronic component 30 and the electrode 36 of the second electronic component 31 to be exposed at the surface of the sealing resin layer 40.

Subsequent to the step (v)", the step (vo)" is carried out. Namely, the metal plating layer is formed such that it is in contact with the exposed surface of the electrode of the first electronic component and the metal layer 10 of the second electronic component. In the step (vi)", the dry plating process is performed with respect to the exposure surface of the sealing resin layer and the exposed surface of the metal layer (see FIG. 7F), and thereafter the wet plating process is performed (see FIG. 7G) to form the metal plating layer 50. Similarly to the first embodiment, Such step (vi)" has such a process feature that a metal layer is directly provided with respect to the exposure surface of the sealing resin layer and the exposed surface of the electrode of the electronic component. The metal plating layer 50 can be provided as a thick layer, and thus it can serve as "heat-releasing part". Particularly when focusing on the manufacturing processes, due to the dry plating process, the plating layer with being thick and having good adhesion can be formed by the subsequent wet plating process. According to the third embodiment of the present invention, the presence of the metal layer 10 enables the electrodes of the first and second electronic components 30, 31 sealed in the sealing resin layer 40 to be exposed at the surface of the sealing resin layer under the condition of the different plane levels from each other. The patterning process of the metal plating layer 50 can provide the metal plating pattern layers "A" 50A and "B" 50B, the metal plating pattern layer "A" 50A being in contact with the electrode 35 of the first electronic component 30, the metal plating pattern layers "B" 50B being in contact with the electrode 36 of the second electronic component 31 (see FIG. 7H). The metal plating pattern layer "A" 50A and the metal plating pattern layer "B" 50B are provided as different-thickness plating pattern layers with their thicknesses being different from each other. In particular, the thickness of the metal plating pattern layer "B" 50B can be larger than that of the metal plating pattern layer "A" 50A, and thus the metal plating pattern layer "B" 50B can suitably serve as a more effective heat-releasing part. While on the other hand, the metal plating pattern layer "A" 50A, which is thinner than the metal plating pattern layer "B" 50B, can suitably serve as a higher-density mounting part such as a narrow pitch connection, a fine wiring and the like.

Figure 7H:
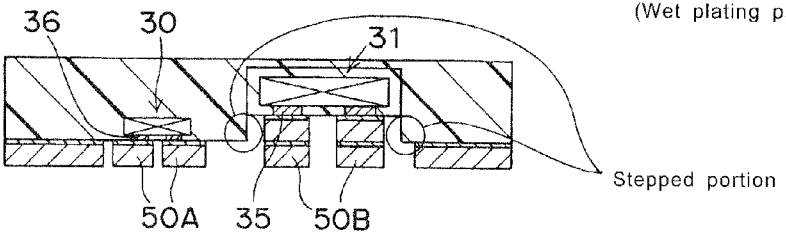

The patterning process of the metal plating layer 50 means a partial removal of the metal layer 10. This enables the surface of the sealing resin layer to be provided with the stepped portion, as shown in FIG. 7H. In other words, the metal layer 10 is partially removed, and thereby the stepped portions are exposed. As seen from the illustration in FIG. 7H, the stepped portion has a size attributed to the meta layer 10, and thus the dimension of the stepped portion can correspond to the thickness dimension of the metal layer 10.

Figure 8:
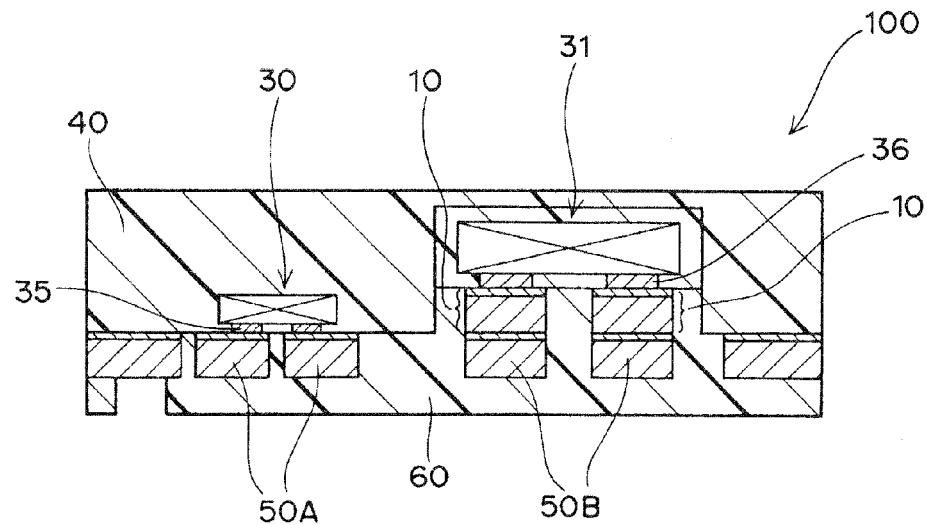
FIG. 8 is a cross-sectional view schematically illustrating a configuration of an electronic component package obtained by the manufacturing method according to the third embodiment of the present invention.

Through the above steps (with an additional steps of the formation of the solder resist layer and the dicing operation for example, similarly to the first embodiment), there can be finally obtained an electronic component package 100 as shown in FIG. 8.

(Concurrent Manufacturing of Plural Electronic Component Packages)

Figure 9:
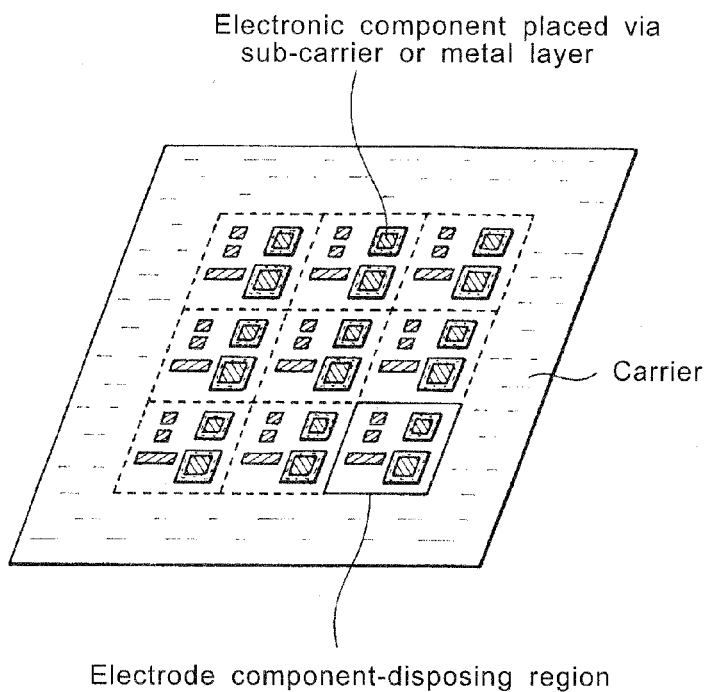
FIG. 9 is a schematic view for an electronic component package precursor with a plurality of electronic component-disposing regions included therein.
Figure 10A:
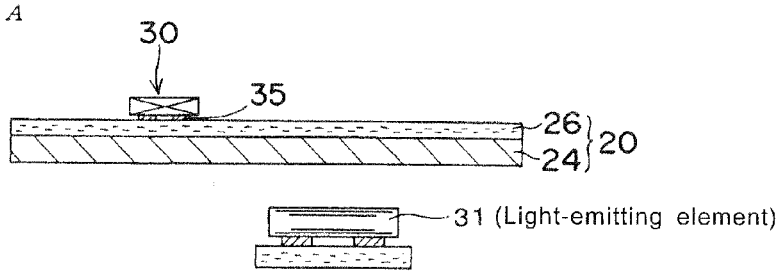
FIGS. 10A to 10G are process-cross sectional views schematically illustrating a manufacturing method of a light-emitting element package according to an embodiment of the present invention.
Figure 10B:
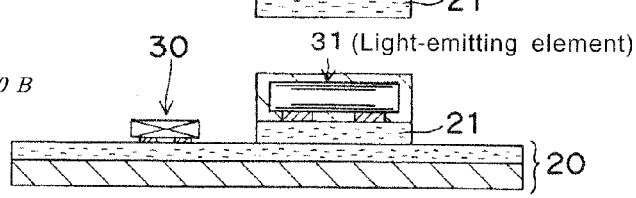
Figure 10C:
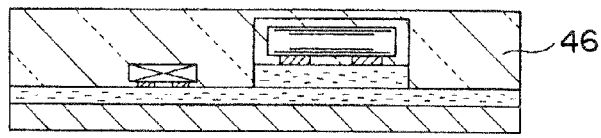
Figure 10D:
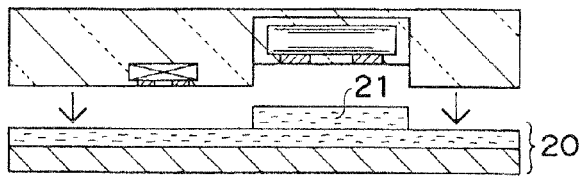
Figure 10E:
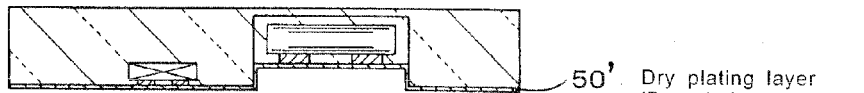
Figure 10F:
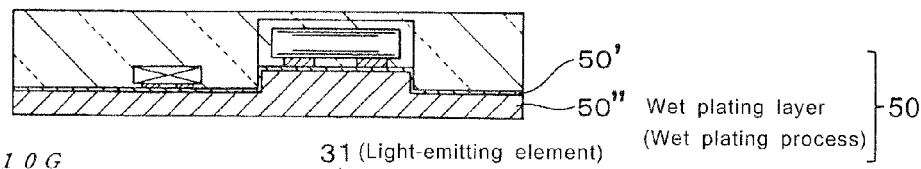
Figure 10G:
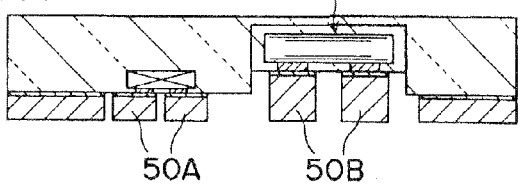

According to an embodiment of the method of the present invention, a plurality of the electronic component packages can be manufactured concurrently. Specifically, as shown in FIG. 9, the electronic components to be used for respective ones of the electronic component packages are placed in the respective ones of electronic component-disposing regions on the carrier, and thereby a precursor of the electronic component packages can be provided (in which a plurality of package precursors are integrated with each other) at a time. By a dicing operation after the peeling removal process, a plurality of the electronic components are provided. Specifically, at any point in time after the peeling removal of the carrier, the dicing operation may be performed to divide the electronic component-disposing regions of the metal pattern layer into respectively-separated regions, which results in a production of the plurality of electronic component packages.

"Electronic component equipped with sub-carrier" and "electronic component equipped with metal layer" can be provided through the above concurrent disposing/dicing processes. For example, "electronic component equipped with sub-carrier" can be produce by concurrently attaching the plurality of the electronic components to the adhesive carrier, followed by the dividing thereof into respective ones of the electronic components 31 by the dicing operation. The arrangement of the electronic components with respect to the sub-carriers and the dicing pitch of the adhesive carrier make it possible to control the size of the indent surface portion formed in the exposure surface of the sealing resin layer. In other words, the area of indent surface portion in the widthwise direction (i.e., the widthwise area of the indent portion, as shown in FIG. 5D) can be controlled, and thereby the widthwise area of the metal plating pattern layer can be controlled. In this regard, it is preferred that the width dimension of the adhesive sub-carrier is larger than that of the electronic component 30 to be placed on such adhesive sub-carrier by 20 μm to 500 μm (e.g., about 100 μm). The width dimension of the adhesive sub-carrier 21 is not limited to this, and thus the adhesive sub-carrier 21 may be much wider than the electronic component 30. For example in a case where the metal plating pattern layer of the electronic component package is required to function to more effectively release the heat, the adhesive sub-carrier 21 may be much wider than the electronic component 31 (e.g., the width dimension of the sub-carrier being about 1000 μm), and thereby the wide and thick metal plating pattern layer may be provided through the formation of the patterned plating layer. The same can be applied to the case of "electronic component equipped with metal layer". The arrangement of the electronic components 31 with respect to the metal layer 10 and the dicing pitch of the metal layer 10 make it possible to control the widthwise area of the exposure surface of the sealing resin, and thereby the widthwise area of the metal plating pattern layer can be controlled.

(Manufacturing of Light-Emitting Package)

An embodiment of the method of the present invention also makes it possible to suitably manufacture a light-emitting element package when the light-emitting element is provided as the electronic component (i.e., when the light-emitting element is included as the electronic component to be placed on the adhesive carrier). In the manufacturing of the light-emitting element package, the formations of a fluorescent layer and a transparent resin layer are performed instead of the formation of the sealing resin layer. Specifically, the fluorescent layer 44 is formed surrounding the light-emitting element, and thereafter the transparent resin layer 46 is formed to cover the light-emitting element and the fluorescent layer. As a result, there can be obtained a desired light-emitting element package (see FIGS. 10A to 10G). It should be noted that FIGS. 10A to 10G is based on the first embodiment, and the manufacturing of light-emitting package according to the second or third embodiment is similar to that of the first embodiment. The formations of the fluorescent layer and the transparent resin layer may be similar to those generally used in a conventional LED package manufacturing.

[Electronic Component Package of Present Invention]

An electronic component package according to an embodiment of the present invention will now be described. The electronic component package of the present invention is a package obtained by the above mentioned manufacturing method according to an embodiment of the present invention.

Figure 11:
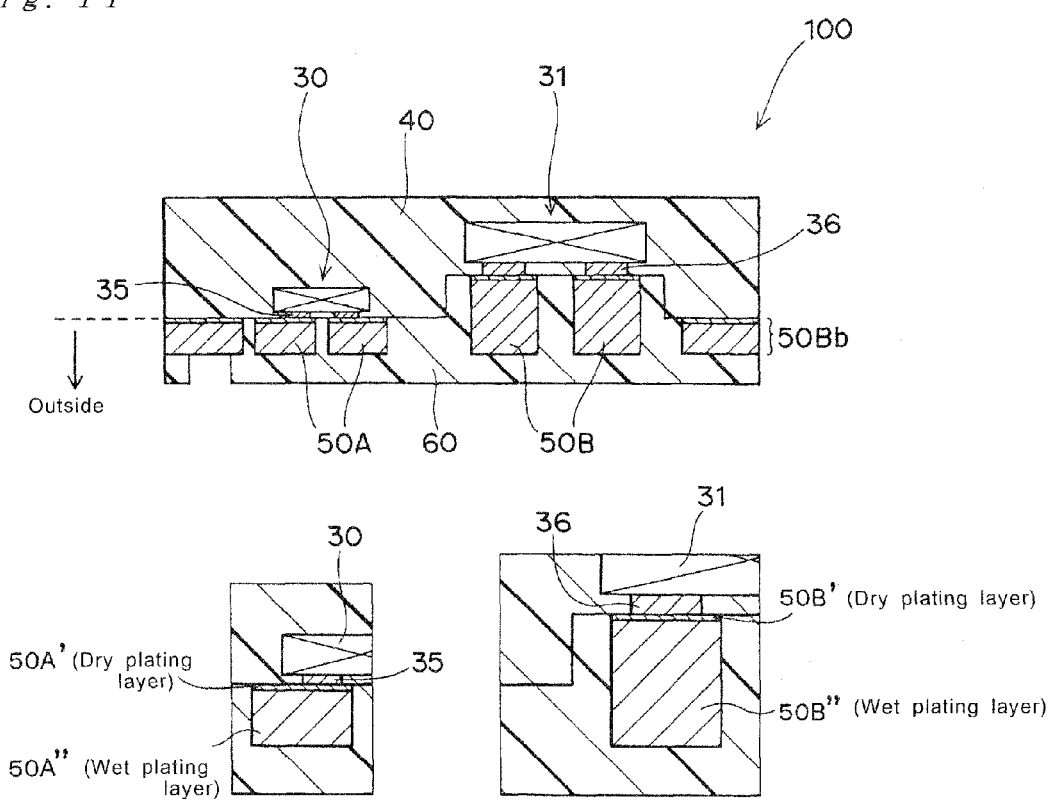
FIG. 11 includes cross-sectional views schematically illustrating a configuration of an electronic component package obtained by the manufacturing method according to the first embodiment of the present invention.

As shown in FIGS. 11, 6 and 8, the electronic component package 100 according to an embodiment of the present invention comprises:

a sealing resin layer 40;

first and second electronic components 30, 31 buried in the sealing resin layer 40, electrodes 35, 36 of the first and second electronic components being flush with a surface of the sealing resin layer 40; and metal plating pattern layers "A" 50A and "B" 50B, the metal plating pattern layer "A" 50A being in connection with the electrode 35 of the first electronic component 30, the metal plating pattern layer "B" 50B being in connection with the electrode 36 of the second electronic component 31.

In the electronic component package 100 according to an embodiment of the present invention, a part of the surface of the sealing resin layer 40 is provided as an indent surface portion, and the electrode (35 or 36) of either one of the first and second electronic components 30, 31 is flush with the indent surface portion, and thereby the electrode 35 of the first electronic component 30 and the electrode 36 of the second electronic component 31 are on the different plane levels from each other. The metal plating pattern layers "A" and "B" 50A, 50B have a layered structure of a wet plating layer (50A'', 50B'') and a dry plating layer (50A', 50B'), the wet plating layer being located relatively outside, the dry plating layer being located relatively inside.

The electronic component package 100 according to an embodiment of the present invention can be provided in various embodiment.

(Electronic Component Package Obtained by Manufacturing Method According to First Embodiment)

FIG. 11 illustrates a configuration of the electronic component package 100 obtained by manufacturing method according to the first embodiment. As shown in FIG. 11, the electronic component package 100 comprises the sealing resin layer 40, the first and second electronic components 30, 31, the metal plating pattern layer "A" 50A in connection with the electrode 35 of the first electronic component 30, and the metal plating pattern layer "B" 50B in connection with the electrode 36 of the second electronic component 31.

As shown in FIG. 11, the first electronic component 30 and the second electronic component 31 are in an embedded state in the sealing resin layer 40. While the first and second electronic components 30, 31 are embedded in the sealing resin layer 40 such that the first and second electronic components 30, 31 are flush with the sealing resin layer 40, the first and second electronic components 30, 31 are positioned on the different plane levels from each other. Namely, "surface of the first electronic component 30" and "surface of the second electronic component 31" are respectively on substantially the same plane level as their surrounding "surface of the sealing resin layer 40". The surface of the sealing resin layer 40 has the indent surface portion, i.e., stepped portion between "surface of the first electronic component 30" and "surface of the second electronic component 31", and thereby "surface of the first electronic component 30" and "surface of the second electronic component 31" are on the different plane levels from each other. As for the electronic component, it is preferred that the electrodes 35, 36 of the electronic components are flush with the sealing resin layer 40. In other words, the surfaces of the electrodes 35, 36 of the electronic components are preferably on substantially the same plane as the surface of the sealing resin layer 40.

In the package according to this embodiment of the present invention, each of the metal plating pattern layers "A" 50A and "B" 50B has a layered structure of the wet plating layer (50A'', 50B'') located relatively outside, and the dry plating layer (50A', 50B') located relatively inside, as shown in FIG. 11. As for the metal plating pattern layers "A" 50A, the dry plating layer 50A' is provided such that it is in direct contact with the electronic component 30 (especially the electrode 35 thereof), and the wet plating layer 50A'' is provided on the dry plating layer (see lower-sided enlarged illustration in FIG. 11). Similarly, in the metal plating pattern layers "B" 50B, the dry plating layer 50B' is provided such that it is in direct contact with the electronic component 31 (especially the electrode 36 thereof), and the wet plating layer 50S'' is provided on the dry plating layer (see lower-sided enlarged illustration in FIG. 11). As such, the phrase " . . . located relatively outside" as used herein substantially means that the layer is located distally with respect to the exposed surface of the electrode of the electronic component, and whereas the phrase " . . . located relatively inside" as used herein substantially means that the layer is located proximally with respect to the exposed surface of the electrode of the electronic component.

In the package according to an embodiment of the present invention, the kind of the first and second electronic components 30, 31 is not necessarily single one. Thus, a plural kinds of electronic components may be provided in the sealing resin layer 40 as the first and second electronic components 30, 31. Examples of the electronic component in the embedded state in the sealing resin layer 40 may include an IC (e.g., control IC), an inductor, a semiconductor element (e.g., MOS: metal-oxide semiconductor), a capacitor, a power element, a light-emitting element (e.g., LED), a chip resistor, a chip capacitor, a chip varistor, a chip thermistor and a chip laminate filter, a connection terminal and the like. According to a preferred embodiment of the present invention, the electrodes 35, 36 of the electronic components are in an exposed state at the surface of the sealing resin layer 40, and the metal plating pattern layers "A" 50A, "B" 50B are respectively in contact with the exposed electrodes 35, 36 of the electronic components.

In the package according to an embodiment of the present invention, "exposed surface of electrode of the electronic component" and "metal plating pattern layer provided on the exposure surface of the sealing resin layer" are in an electrical connection with each other via at least a part of the metal plating pattern layers "A" and "B". This leads to an provision of an desired wiring form. In other words, a suitable wiring form enables the metal plating pattern layers A(50A) and B(50B) to be in an electrical connection with each other, and thereby "electrodes 35, 36 of the electronic components" and "metal plating pattern layer provided on the exposure surface of the sealing resin layer" are in an indirect connection with each other. With this wiring form, the heat from the electronic component, if any, can be suitably released through the metal plating pattern layers A, B and the metal plating pattern layer provided on the exposure surface of the sealing resin layer.

The sealing resin layer 40, in which the electronic components are embedded, comprises an epoxy-based resin or a silicone-based resin, for example. The thickness of the sealing resin layer is preferably in the approximate range of 0.5 mm to 5.0 mm, and more preferably in the approximate range of 1.2 mm to 1.8 mm.

In the electronic component package according to an embodiment of the present invention, the dry plating layer (50A', 50B'), which is formed by the dry plating process, preferably comprises at least one kind of metal material selected from the group consisting of Ti (titanium), Cr (chromium) and Ni (nickel). Alternatively, the dry plating layer (50A', 50B') may comprise other metal material, for example at least one metal material selected from the group consisting of Ag (silver), Al (aluminum), Al alloy, Au (gold), Pt (platinum), Sn (tin), Cu (copper), W (tungsten) and the like. The dry plating layer (50A', 50B') may serve as a stress-relaxation layer, which may improve the connection reliability of the electronic component package. While on the other hand, the wet plating layer (50A", 50B"), which is formed by the wet plating process, preferably comprises at least one kind of metal material selected from the group consisting of Cu (copper) and Al (aluminum). Alternatively, the wet plating layer (50A", 50B") may comprise other metal material, for example at least one metal material selected from the group consisting of Ag (silver), Pd (palladium), platinum (Pt) and nickel (Ni). However, when focusing on "heat releasing" in particular, it is preferred that the material of the wet plating layer (50A", 50B") has high thermal conductivity which effectively contributes to the heat releasing of the package. In this regard, the material of the wet plating layer (50A", 50B") preferably comprises the copper (Cu).

The dry plating layer (50A', 50B') has a very thin form, and preferably has the thickness of nano-order, whereas the wet plating layer (50A", 50B") has a thick form, and preferably has the thickness of micron-order. This means that most of the metal plating pattern layers "A" and "B" (50A, 50B) consists of the wet plating layer. By way of example, the thickness of the dry plating layer (50A', 50B') is preferably in the range of 100 nm to 3000 nm (for example, thickness 300 nm of Ti plus thickness 1000 nm of Cu), the thickness of the wet plating layer (50A", 50B") is preferably in the approximate range of 5 µm to 500 µm, more preferably in the approximate range of 18 µm to 250 µm, most preferably in the approximate range of 18 µm to 125 µm. As such, the wet plating layer (50A", 50B") is thick, and thereby the large thickness of the metal plating pattern layers "A" and "B" (50A, 50B) can be suitably achieved.

As seen from FIG. 11, the electronic components 30, 31 and the metal plating pattern layers "A", "B" (50A, 50B) (directly) have mutual surface contact (or direct bonding/surface bonding) with each other. As such, the metal plating pattern layers "A", "B" (50A, 50B) and the electronic components 30, 31 are in electrical connection with each other. Each of the dry plating layers 50A', 50B' of the metal plating pattern layers "A", "B" (50A, 50B) is such a thin layer that exhibits the negligible thermal resistance or electrical resistance. It can be thus considered in the present invention that the thick wet plating layers 50A", 50B" of the metal plating pattern layers "A", "B" (50A, 50B) are in direct surface contact (or direct bonding/surface bonding) with the electronic components 30, 31, especially the electrodes 35, 36 thereof.

Figure 12:
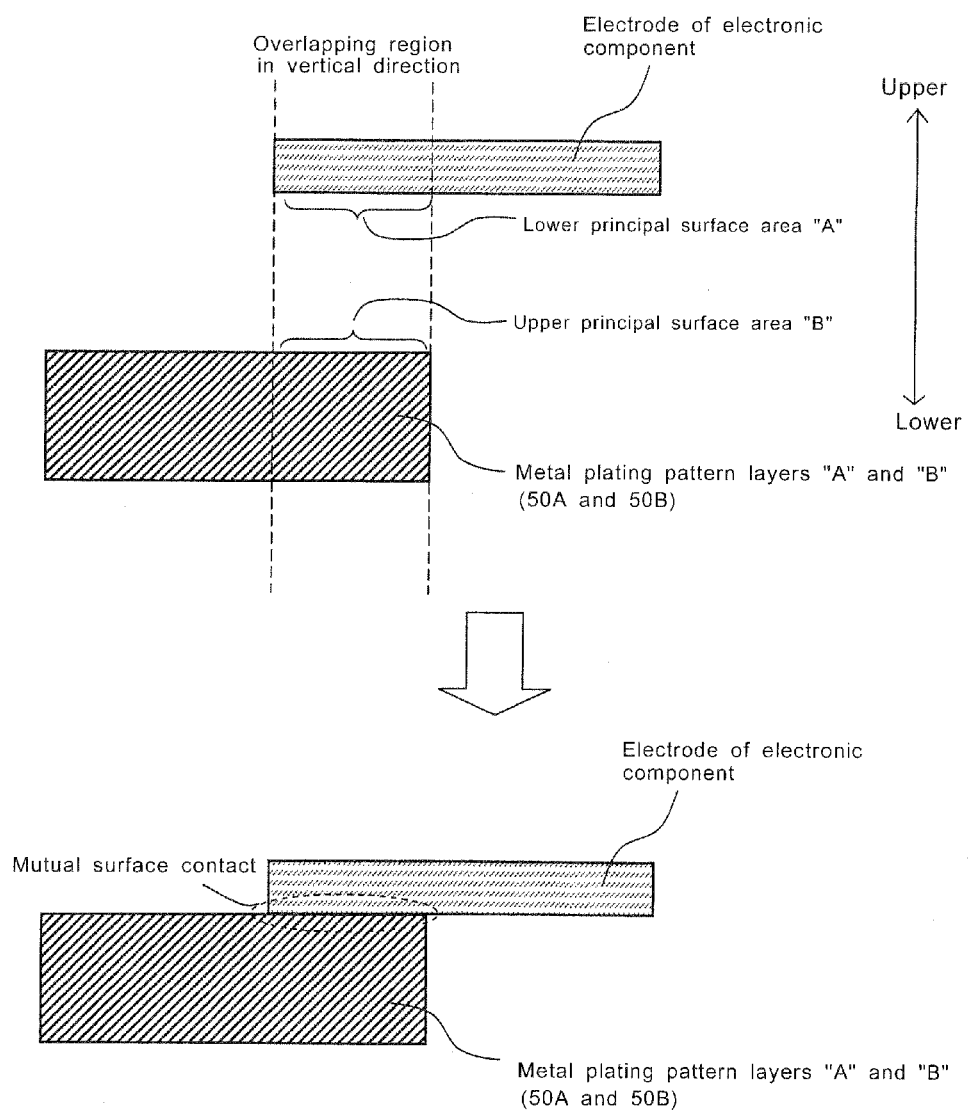
FIG. 12 includes schematic views for explaining "surface contact" (i.e., "direct bonding"/"surface bonding") according to an embodiment of the present invention.

The term "surface contact" (or direct bonding/surface bonding) used herein means an embodiment wherein principal surfaces (upper and lower surfaces) of respective ones of the objects are contacted or bonded with each other, in particular an embodiment wherein overlapping regions between the principal surfaces (upper and lower surfaces) of respective ones of the objects are all contacted with each other. More specifically, the term "surface contact" (or direct bonding/surface bonding) means an embodiment wherein the overlapping regions between "principal surface of the electronic component (i.e., lower principal surface of the electrode thereof, exposed at the sealing resin layer)" and "principal surface (i.e., upper principal surface) of the metal plating pattern layer" are all contacted with each other. In other words, the term "surface contact (or direct bonding/surface bonding)" used herein means an embodiment wherein the mutual overlapping regions of the metal plating pattern layer and the electronic component (especially electrode thereof) are all contacted, which corresponds to an embodiment shown in FIG. 12 where the lower principal surface area "A" and the upper principal surface area "B" are all contacted with each other.

Due to the thick metal plating pattern layer provided based on "direct bonding or surface contact", the electronic component package can have an improved mechanical strength as a whole. As a result, the metal plating pattern layers "A" and "B" (50A, 50B) can serve as a supporting layer for the electronic component and/or the metal pattern layer. Furthermore, due to "surface contact" (or direct bonding/surface bonding), the metal plating pattern layer is capable of effectively releasing the heat from the electronic component via such metal plating pattern layer to the outside. That is, the metal plating pattern layers "A" and "B" serve not only as the supporting layer of the package, but also as a heat sink which effectively contributes to the high-heat releasing performance of the package. As for the heat sink of the electronic component package, at least a part of the metal plating pattern layers "A" 50A and/or "B" 50B can serve as a heat-releasing part of the package. In other words, the metal plating pattern layer "A" 50A, the metal plating pattern layer "B" 50B, and/or the further metal plating pattern provided on the exposure surface of the sealing resin layer, all of which are in direct or indirect connection with the electrode of the electronic component, can be used as the heat-releasing part in the electronic component package.

Due to the high heat-releasing of the package, a performance, an operating lifetime and the like of the electronic component can be increased, and also degeneration and discoloration of the sealing resin, which are attributed to the heat, can be effectively prevented. Furthermore, due to the "surface contact" (or direct bonding/surface bonding), the electric resistance of the package is more desirable than that of the case of the electrical connection via bump or wire. As such, the package according to an embodiment of the present invention enables a larger electric current to be applied therein. For example, in a case of the light-emitting package (e.g., LED package), the higher luminance can be achieved due to the high heat-releasing and the large electric current.

In the electronic component package according to an embodiment of the present invention, the thickness of the metal plating pattern layer "A" 50A and the thickness of the metal plating pattern layer "B" 50B differ from each other. As seen from the illustration of FIG. 11, while the outermost surface of the metal plating pattern layer "A" 50A (i.e., outside surface of the wet plating layer 50A") and the outermost surface of the metal plating pattern layer "B" 50B (i.e., outside surface of the wet plating layer 50B") are on the same plane level as each other, the innermost surfaces thereof are not on the same plane level as each other. As such, the metal plating pattern layers "A" and "B" (50A, 50B) have different thickness from each other.

More specifically, the lower principal surface of the second electronic component 31 (especially, the electrode 36 thereof), which is exposed at the surface of the sealing resin layer, and is in connection with the metal plating pattern layer "B" 50B, is located relatively inside, with respect to the lower principal surface of the first electronic component 30 (especially, the electrode 35 thereof), which is also exposed at the surface of the sealing resin layer, and is in connection with the metal plating pattern layer "A" 50A. Due to this, the metal plating pattern layer "B" 50B has the larger thickness than that of the metal plating pattern layer "A" 50A. The metal plating pattern layer "B" 50B with its thick form can be locally located with respect to the electronic component requiring a more heat releasing, large electric current driving, and the like, which leads to an achievement of a more effective high heat releasing. As for the improved heat releasing, the second electronic component 31 with which the thicker metal plating pattern layer is in connection is in an embedded state in the sealing resin layer 40 such that the second electronic component 31 is located closer to the upper surface of the sealing resin layer 40 due to the indent surface portion (i.e., stepped portion) of the sealing resin layer 40. This makes it possible to readily release the heat from the second electronic component 31 to the outside through the upper surface of the sealing resin layer 40. As such, the embodiment of the present invention can suitably achieve the improved heat releasing in view of not only the thicker metal plating pattern layer, but also the positioning level of the electronic component within the sealing resin layer.

In the electronic component package according to an embodiment of the present invention, not only the improved heat releasing is provided, but also the higher density can be provided since no lead frame is needed due to the mutual surface contact (or direct bonding/surface bonding). This allows the narrow-pitch connection with respect to the exposed surface of the electrode of the electronic component, and also the formation of the fine wirings. In particular, the metal plating pattern layer "A" 50A, which is thinner than the metal plating pattern layer "B" 50B, can contribute to the high-density connection or wirings. As such, the embodiment of the present invention can achieve the packaging of higher-function and higher-density electronic component. For example, the metal plating pattern layer "A" 50A can be locally located with respect to the electronic component (e.g., IC) which requires narrower pitch connection and fine wirings due to the higher-density and downsizing thereof. The metal plating pattern layer "A" 50A can contribute to the narrower pitch connection and fine wirings.

As for the difference in thickness in the electronic component package according to an embodiment of the present invention, the metal plating pattern layer "A" may comprise a further metal plating pattern layer "A'" in contact with a sealing resin layer's surface which is flush with the electrode of the first electronic component. The thickness of the further metal plating pattern layer "A'" may be different from that of the metal plating pattern layer "A". Similarly, the metal plating pattern layer "B" may comprise a further metal plating pattern layer "B'" in contact with a sealing resin layer's surface which is flush with the electrode of the second electronic component. The thickness of the further metal plating pattern layer "B'" may be different from that of the metal plating pattern layer "B". Referring to FIG. 11, the further metal plating pattern layer "B'" (50Bb) has the different thickness from that of the metal plating pattern layer "B" (50B), and particularly the further metal plating pattern layer "B'" (50Bb) is thinner than the metal plating pattern layer "B" (50B). Such difference in thickness is directly or indirectly attributed to the indent surface portion i.e., stepped portion of the surface of the sealing resin layer 40.

The package according to an embodiment of the present invention may be provided with a resist layer in order to achieve an more preferred form as a package product. In this regard, the electronic component package may comprise a resist layer provided with respect to the metal plating pattern layers "A" and "B". More specifically, it is preferred as shown in FIG. 11 that the solder resist layer 60 can be provided such that the metal plating pattern layers "A" 50A and "B" 50B are partially covered with the resist layer 60. The resist layer 60 in itself may be the same as that generally provided in the electronics packaging field.

(Electronic Component Package Obtained by Manufacturing Method According to Second Embodiment)

FIG. 6 illustrates a configuration of the electronic component package 100 obtained by manufacturing method according to the second embodiment. As shown in FIG. 6, the electronic component package 100 has a similar configuration to that of the first embodiment (and thus the description for items overlapping the first embodiment will be omitted).

The electronic component package 100 obtained by manufacturing method according to the second embodiment is characterized in that both of the first and second electronic components are flush with the indent surface portion of the sealing resin layer. In contrast, the electronic component package 100 obtained by manufacturing method according to the first embodiment has such a configuration that only the second electronic component 31 is flush with the indent surface portion of the sealing resin layer. In the electronic component package 100 obtained by manufacturing method according to the second embodiment, as shown in FIG. 6, not only the second electronic component 31 is flush with the indent surface portion of the sealing resin layer, but also the first electronic component 30 is flush with another indent surface portion of the sealing resin layer. The concave dimensions (i.e., stepped portion's dimensions) of the former and the latter regarding the indent surface portion are different from each other, and thereby the thickness of the metal plating pattern layer "A" 50A and the thickness of the metal plating pattern layer "B" 50B differ from each other.

Specifically, the lower principal surface of the second electronic component 31 (especially, the electrode 36 thereof), which is exposed at the surface of the sealing resin layer, and is in connection with the metal plating pattern layer "B" 50B, is located relatively inside, with respect to the lower principal surface of the first electronic component 30 (especially, the electrode 35 thereof), which is also exposed at the surface of the sealing resin layer, and is in connection with the metal plating pattern layer "A" 50A. This is due to the fact that the thickness of the second adhesive sub-carrier 21B is larger than the thickness of the first adhesive sub-carrier 21A, the adhesive sub-carriers 21B, 21A having been used in the manufacturing method of the package. As such, the metal plating pattern layer "B" 50B has the larger thickness than that of the metal plating pattern layer "A" 50A. The metal plating pattern layer "B" 50B with its thick form can be locally located with respect to the electronic component requiring a more heat releasing, large electric current driving, and the like, which leads to an achievement of a more effective high heat releasing. The difference in thickness between the metal plating pattern layers "A" 50A and "B" 50B is preferably in the range of 2 µm to 100 µm, more preferably in the range of 5 µm to 100 µm (for example, about 50 µm). In the electronic component package according to the second embodiment of the present invention, not only the improved heat releasing is provided, but also the higher density can be provided since no lead frame is needed due to the mutual surface contact (or direct bonding/surface bonding). This allows the narrow-pitch connection with respect to the exposed surface of the electrode of the electronic component, and also the formation of the fine wirings. In particular, the metal plating pattern layer "A" 50A, which is thinner than the metal plating pattern layer "B" 50B, can contribute to the high-density connection or wirings. As such, the embodiment of the present invention can achieve the packaging of higher-function and higher-density electronic component. For example, the metal plating pattern layer "A" 50A can be locally located with respect to the electronic component (e.g., IC) which requires narrower pitch connection and fine wirings due to the higher-density and downsizing thereof. The metal plating pattern layer "A" 50A can contribute to the narrower pitch connection and fine wirings.

(Electronic Component Package Obtained by Manufacturing Method According to Third Embodiment)

FIG. 8 illustrates a configuration of the electronic component package 100 obtained by manufacturing method according to the third embodiment. As shown in FIG. 8, the electronic component package 100 has a similar configuration to that of the first embodiment (and thus the description for items overlapping the first embodiment will be omitted).

The electronic component package 100 obtained by manufacturing method according to the third embodiment is characterized in that the metal plating pattern layer "B" 50B for the second electronic component includes the metal layer 10. In this regard, due to the fact that the metal layer 10 in itself can be provided by the plating process, the metal plating pattern layer "B" 50B for the second electronic component has more number of the layers as a whole. For example, the metal plating pattern layer "B" 50B has a four-layered structure, i.e., two of structure composed of "wet plating layer located relatively outside" and "dry plating layer located relatively inside". In the electronic component package 100 according to the third embodiment, the thickness of the metal plating pattern layer "A" 50A and the thickness of the metal plating pattern layer "B" 50B differ from each other.

Specifically, the lower principal surface of the second electronic component 31 (especially, the electrode 36 thereof), which is exposed at the surface of the sealing resin layer, and is in connection with the metal plating pattern layer "B" 50B, is located relatively inside, with respect to the lower principal surface of the first electronic component 30 (especially, the electrode 35 thereof), which is also exposed at the surface of the sealing resin layer, and is in connection with the metal plating pattern layer "A" 50A. The metal plating pattern layer "B" 50B has the larger thickness than that of the metal plating pattern layer "A" 50A by the thickness of the metal layer 10. As such, the metal plating pattern layer "B" 50B can be locally located with respect to the electronic component requiring a more heat releasing, large electric current driving, and the like, which leads to an achievement of a more effective high heat releasing. The difference in thickness between the metal plating pattern layers "A" and "B" 50A, 50B can be controlled by the thickness of the metal layer 10. In this regard, the difference in thickness between the metal plating pattern layers "A" 50A and "B" 50B is preferably in the range of 2 μm to 100 μm, more preferably in the range of 5 μm to 100 μm (for example, about 50 μm). In the electronic component package according to the second embodiment of the present invention, not only the improved heat releasing is provided, but also the higher density can be provided since no lead frame is needed due to the mutual surface contact (or direct bonding/surface bonding). This allows the narrow-pitch connection with respect to the exposed surface of the electrode of the electronic component, and also the formation of the fine wirings. In particular, the metal plating pattern layer "A" 50A, which is thinner than the metal plating pattern layer "B" 50B, can contribute to the high-density connection or wirings. As such, the embodiment of the present invention can achieve the packaging of higher-function and higher-density electronic component. For example, the metal plating pattern layer "A" 50A can be locally located with respect to the electronic component (e.g., IC) which requires narrower pitch connection and fine wirings due to the higher-density and downsizing thereof. The metal plating pattern layer "A" 50A can contribute to the narrower pitch connection and fine wirings.

(Electronic Component Package with Light-Emitting Element Included Therein)

Figure 13:
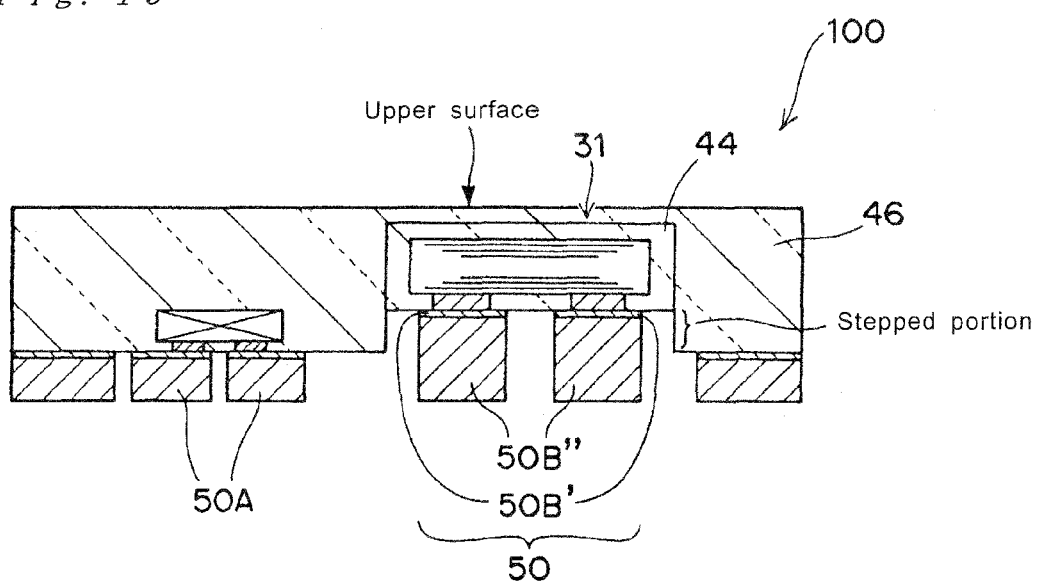
FIG. 13 is a cross-sectional view schematically illustrating a configuration of an electronic component package (light-emitting element package) according to an embodiment of the present invention.

In a case where a light-emitting element is included as the electronic component, and thus the electronic component package is a light-emitting element package, a fluorescent layer and a transparent resin layer are preferably provided. Instead of the sealing resin layer in which the electronic component is embedded, it is preferred as shown in FIG. 13 that the fluorescent layer 44 is provided surrounding the light-emitting element 31, and also the transparent resin layer 46 is provided such that the light-emitting element 30 and the fluorescent layer 44 are covered with the transparent resin layer. This makes it possible to achieve an more preferred form of the electronic component package 100 as the light-emitting element package. The material and thickness for the fluorescent layer and the transparent resin layer may be the same as those conventionally used in the general LED packages. The term "light-emitting element" used herein substantially means an element capable of emitting the light. Examples of the light-emitting element include a light-emitting diode (LED) and an electronic component equipped therewith. As such, the term "light-emitting element" as used herein means not only a "bare chip type LED (i.e., LED chip)" but also a "discrete type light-emitting element wherein a molding of the LED chip is provided". The LED chip may also be a semiconductor laser chip.

In a case where of the package including the light-emitting element as the electronic component, the dry plating layer (e.g., layer 50B' in FIG. 13) of the metal plating pattern layer can be suitably used as, a reflective layer. In this case, the reflective layer is located beneath the light-emitting element such that they are adjacent to each other. The downward light emitted from the light-emitting element can be reflected by this reflective layer, i.e., the dry plating layer of the metal plating pattern layer B. As a result, the downward light emitted from the light-emitting element can be eventually reoriented upwardly by the reflective layer. When the high reflectivity is an important consideration, the dry plating layer (e.g., layer 50B' in FIG. 13) of the metal plating pattern layer preferably comprises metal material selected from the group of Ag (silver) and Al (aluminum).

As for the light extraction from the light-emitting element, the electronic component package according to an embodiment of the present invention is excellent in terms of the light extraction through the upper surface of the sealing resin layer. Specifically, in the electronic component package according to an embodiment of the present invention, due to the indent surface portion (i.e., stepped portion) of the sealing resin layer, the light-emitting element 31 is in an embedded state in the sealing resin layer (especially, in the transparent resin layer 46) such that the light-emitting element 31 is located closer to the upper surface of the sealing resin layer. As a result, there can be improved the light extraction efficiency from the upper surface of the resin layer (i.e., from light extraction surface of the package).

It should be noted that the present invention as described above includes the following aspects:

The First Aspect:

A method for manufacturing an electronic component package, wherein a first electronic component and a second electronic component are placed on a carrier and a sealing resin layer is formed on the carrier, followed by the carrier being peeled away to be removed, and thereby providing a package precursor in which the first and second electronic components are embedded such that an electrode of at least one of the first and second electronic components is exposed at a surface of the sealing resin layer, wherein, upon the placing of the first and second electronic components, the first and second electronic components are positioned such that their height levels of the first and second electronic components differ from each other, and wherein, after the removal of the carrier, a metal plating layer is formed such that the metal plating layer is in contact with the exposed surface of the electrode of the electronic component (i.e., first electronic component and/or second electronic component).

The Second Aspect:

The method according to the first aspect, wherein either one or both of the first and second electronic components placed on the carrier is an electronic component equipped with a sub-carrier or a metal layer, and thereby the different height levels of the first and second electronic components from each other is provided due to the sub-carrier or the metal layer.

The Third Aspect:

The method according to the first or second aspect, wherein, after the removal of the carrier, a metal plating pattern layer "A" and a metal plating pattern layer "B" are formed, the metal plating pattern layer "A" being in connection with the electrode of the first electronic component, the metal plating pattern layer "B" being in connection with the electrode of the second electronic component, and wherein their thicknesses of the metal plating pattern layers "A" and "B" differ from each other due to the different height levels of the first and second electronic components.

The Fourth Aspect:

The method according to the second or third aspect, wherein a peeling removal of the sub-carrier or a partial removal of the metal layer is performed to form an indent surface portion or a stepped portion in the surface of the sealing resin layer.

The Fifth Aspect:

The method according to the fourth aspect, wherein the peeling removal of the carrier causes the exposed electrode of the at least one of the first and second electronic components to be flush with the surface of the sealing resin layer, and wherein the peeling removal of the sub-carrier causes the exposed electrode of either one of the first and second electronic components to be flush with the indent surface portion.

The Sixth Aspect:

The method according to any one of the second to fifth aspects, comprising the steps of:

(i) placing the first electronic component onto an adhesive carrier used as the carrier;

(ii) providing the second electronic component equipped with an adhesive sub-carrier as the sub-carrier, (iii) placing the second electronic component equipped with the adhesive sub-carrier onto the adhesive carrier, the placed second electronic component being not overlapped with the placed first electronic component;

(iv) forming the sealing resin layer on the adhesive carrier such that the first and second electronic components are covered with the sealing resin layer, and thereby the precursor of the electronic component package is produced;

(v) peeling away the adhesive carrier and the adhesive sub-carrier from the precursor of the electronic component package, and thereby the electrode of the first electronic component and the electrode of the second electronic component are exposed at the surface of the sealing resin layer; and (vi) forming the metal plating layer such that the metal plating layer is in contact with the exposed surface of the electrode of the first electronic component and the exposed surface of the electrode of the second electronic component, wherein the different height levels of the first and second electronic components from each other is provided in the step (iii) due to the adhesive sub-carrier located between the adhesive carrier and the second electronic component, and wherein the formation of the metal plating layer in the step (vi) is performed by a dry plating process and a subsequent wet plating process.

The Seventh Aspect:

The method according to any one of the second to fifth aspects, comprising the steps of:

(i)' providing the first electronic component equipped with a first adhesive sub-carrier used as the sub-carrier;

(ii)' providing the second electronic component equipped with a second adhesive sub-carrier used as the sub-carrier;

(iii)' placing the first electronic component equipped with the first adhesive sub-carrier and the second electronic component equipped with the second adhesive sub-carrier on a supporting substrate, the placed first and second electronic components being not overlapped with each other;

(iv)' forming the sealing resin layer on the supporting substrate such that the first and second electronic components are covered with the sealing resin layer, and thereby the precursor of the electronic component package is produced;

(v)' peeling away the supporting substrate, the first adhesive sub-carrier and the second adhesive sub-carrier from the precursor of the electronic component package, and thereby the electrode of the first electronic component and the electrode of the second electronic component are exposed at the surface of the sealing resin layer; and (vi)' forming the metal plating layer such that the metal plating layer is in contact with the exposed surface of the electrode of the first electronic component and the exposed surface of the electrode of the second electronic component, wherein the different height levels of the first and second electronic components from each other is provided in the step (iii)' due to the first adhesive sub-carrier located between the supporting substrate and the first electronic component and the second adhesive sub-carrier located between the supporting substrate and the second electronic component, and wherein the formation of the metal plating layer in the step (vi)' is performed by a dry plating process and a subsequent wet plating process.

The Eighth Aspect:

The method according to any one of the second to fifth aspects, comprising the steps of:

(i)" placing the first electronic component onto an adhesive carrier used as the carrier;

(ii)" providing the second electronic component equipped with the metal layer;

(iii)" placing the second electronic component equipped with the metal layer onto the adhesive carrier, the placed second electronic component being not overlapped with the placed first electronic component;

(iv)" forming the sealing resin layer on the adhesive carrier such that the first and second electronic components are covered with the sealing resin layer, and thereby the precursor of the electronic component package is produced;

(v)" peeling away the adhesive carrier from the precursor of the electronic component package, and thereby the electrode of at least one of the first and second electronic components is exposed at the surface of the sealing resin layer; and (vi)" forming the metal plating layer such that the metal plating layer is in contact with the exposed surface of the electrode of the at least one of the first and second electronic components, wherein the different height levels of the first and second electronic components from each other is provided in the step (iii)" due to the metal layer located between the adhesive carrier and the second electronic component, and wherein the formation of the metal plating layer in the step (vi)" is performed by a dry plating process and a subsequent wet plating process.

The Ninth Aspect:

The method according to any one of the sixth to eighth aspects, wherein a sputtering is performed as the dry plating process, whereas an electroplating is performed as the wet plating process.

The Tenth Aspect:

The method according to any one of the sixth to ninth aspects, wherein a dry plating layer with its thickness of 100 nm to 1000 nm is formed by the dry plating process, whereas a wet plating layer with its thickness of 5 μm to 500 μm is formed by the wet plating process.

The Eleventh Aspect:

The method according to any one of the sixth to tenth aspects, wherein the metal plating layer is subjected to a patterning process to form a metal plating pattern layer "A" and a metal plating pattern layer "B" therefrom, the metal plating pattern layer "A" being at least in contact with the exposed surface of the electrode of the first electronic component, the metal plating pattern layer "B" being at least in contact with the exposed surface of the electrode of the second electronic component.

The Twelfth Aspect:

The method according to any one of the first to eleventh aspects, wherein a light-emitting element is included as the electronic component to be placed on the carrier, and instead of forming the sealing resin layer, a fluorescent layer is formed surrounding the light-emitting element, and thereafter a transparent resin layer is formed to cover the light-emitting element and the fluorescent layer.

The Thirteenth Aspect:

An electronic component package, comprising:

a sealing resin layer;

first and second electronic components buried in the sealing resin layer, an electrode of each of the first and second electronic components being flush with a surface of the sealing resin layer; and metal plating pattern layers "A" and "B", the metal plating pattern layer "A" being in connection with the electrode of the first electronic component, the metal plating pattern layer "B" being in connection with the electrode of the second electronic component, wherein a part of the surface of the sealing resin layer is provided as an indent surface portion, and the electrode of either one of the first and second electronic components is flush with the indent surface portion, and thereby the electrode of the first electronic component and the electrode of the second electronic component are on the different plane levels from each other, and wherein each of the metal plating pattern layers "A" and "B" has a layered structure of a wet plating layer and a dry plating layer, the wet plating layer being located relatively outside, the dry plating layer being located relatively inside.

The Fourteenth Aspect:

The electronic component package according to the thirteenth aspect, wherein the thicknesses of the metal plating pattern layers "A" and "B" are different from each other.

The Fifteenth Aspect:

The electronic component package according to the thirteenth or fourteenth aspect, wherein an outside surface of the wet plating layer of the metal plating pattern layer "A" is on the same plane level as an outside surface of the wet plating layer of the metal plating pattern layer "B".

The Sixteenth Aspect:

The electronic component package according to any one of the thirteenth to fifteenth aspects, wherein the metal plating pattern layer "A" comprises a further metal plating pattern layer "A'", and the metal plating pattern layer "B" comprises a further metal plating pattern layer "B'", the further metal plating pattern layer "A'" being in contact with a sealing resin layer's surface which is flush with the electrode of the first electronic component, the further metal plating pattern layer "B'" being in contact with a sealing resin layer's surface which is flush with the electrode of the second electronic component, and wherein a thickness of the further metal plating pattern layer "A'" is different from that of the metal plating pattern layer "A", and a thickness of the further metal plating pattern layer "B'" is different from that of the metal plating pattern layer "B".

The Seventeenth Aspect:

The electronic component package according to any one of the thirteenth to sixteenth aspects, wherein at least a part of the metal plating pattern layers "A" and/or "B" serves as a heat-releasing part of the electronic component package.

The Eighteenth Aspect:

The electronic component package according to any one of the thirteenth to seventeenth aspects, wherein the dry plating layer has a thickness of 100 nm to 1000 nm, whereas the wet plating layer has a thickness of 4 μm to 500 μm.

The Nineteenth Aspect:

The electronic component package according to any one of the thirteenth to eighteenth aspects, wherein the dry plating layer comprises at least one kind of a metal material selected from a group consisting of Ti, Cr and Ni, whereas the wet plating layer comprises at least one kind of a metal material selected from a group consisting of Cu, Ni and Al.

The Twentieth Aspect:

The electronic component package according to any one of the fifteenth to nineteenth aspects when appendant to the fourteenth aspect, wherein the difference in thickness between the metal plating pattern layers "A" and "B" is in the range of 2 μm to 100 μm.

The Twenty-First Aspect:

The electronic component package according to any one of the thirteenth to twentieth aspects, wherein a light-emitting element is provided as the electronic component, and instead of the sealing resin layer, a fluorescent layer is provided such that it surrounds the light-emitting element, and also a transparent resin layer is provided such that the light-emitting element and the fluorescent layer are covered with the transparent resin layer.

While some embodiments of the present invention have been hereinbefore described, they are merely the typical embodiments. It will be readily appreciated by those skilled in the art that the present invention is not limited to the above embodiments, and that various modifications are possible without departing from the scope of the present invention.

For example, the peeled carrier or sub-carrier, which has been already removed from the precursor, may be re-used. That is, the used carrier or sub-carrier can be used for the manufacturing of another electronic component package at a later stage.

EXAMPLES

The electronic component package was manufactured according to an embodiment of the present invention.
(Material for Package)
The "adhesive carrier (adhesive film)" and "sealing resin layer" used for the manufacturing of the package were as follows.

| Carrier (Adhesive carrier) | Single-faced adhesive tape (adhesive layer: about 15 μm and polyester film: about 200 μm) |
| Sub-carrier (Adhesive carrier) | Single-faced adhesive tape (adhesive layer: about 10 μm and polyester film: about 18 μm) |
| Sealing resin layer | Liquid epoxy resin |

The electronic component package was obtained after the following processes.

| Placing | Mounting of electronic component, or another electronic component equipped with sub-carrier having desirably-diced size (or another electronic component equipped with mtal pattern layer formed therein) onto carrier. |
| --- | --- |
| Sealing resin preparation | Metering of predetermined amount of liquid epoxy rein, and then filling die therewith |
| Vacuum heat press | Charging die in heat press (heated at about 50° C.), and decompression into a pressure of about -0.1 MPa by vacuum pump, followed by holding it for about five minutes. Then, heating up to about 120° C. and pressurizing up to about 0.1 MPa, followed by holding it for about 15 minutes. |
| Demolding | Removal of die from heat press, followed by cooling thereof. Then, sample was taken out from die. |
| After-cure | Complete curing by dryer (about 150° C.) for about 60 minutes (in the air). |
| Removal | Removal of both of carrier and sub-carrier (i.e., adhesive carrier), and then precursor was taken out |
| Metal sputtering | Providing precursor in sputtering apparatus. Then, reverse sputtering plus Ti sputtering (about 200 Å, and Cu sputtering (about 1000 Å) |
| Electrolytic Cu plating | Electrolytic Cu plating to provide desired thickness of plating layer. |
| Liquid resist formation | Application of liquid resist ink by spin-coater. Drying until no tack is provided. |
| Lithographic exposure and development | Exposure to UV light via patterned mask, and then development of liquid resist with developer. |
| Etching | Etching of Cu with ferric chloride solution, and then removal of Ti layer with Ti etching liquid. |
| Removal | Removal of liquid resist with alkaline stripping liquid |
| Soder resist application | Screen printing of photosensitive solder resist print ink. Heat treatment until no adhesiveness is provided. |
| Lithographic exposure and development | Exposure to UV light via patterned mask, and then development. |
| Curing | Complete cure of solder resist by heat treatment. |
| Dicing | Cut into pieces with desired size by blade (with its width dimension of about 0.2 mm) of dicer device. |
| Stamping | Stamping of serial number on surface of sealing resin. |
| Inspection | Examining of electrical function. |
| Completion | Completion |

As a result of the above processes, there was able to be obtained the package with "substrate-less", "wire bonding-less/bump-less", "solder material-less". It was confirmed that the presence of the metal pattern layer locally located between the sealing resin layer and the adhesive carrier had been able to be facilitated the peeling operation. It was also confirmed that the bump-less thick metal plating layer was formed with respect to "exposed surface of metal pattern layer" and "exposed surface of electrode of electronic component" (both of the exposed surfaces had been provided by the peeling of the adhesive carrier), the thick metal plating layer being capable of serving suitably as a heat sink.

INDUSTRIAL APPLICABILITY

The present invention can be suitably used in various applications of electronics packaging field. For example, the present invention can be suitably available in an electric source package (e.g., POL converter such as voltage step down DC-DC converter), a LED package, a module with a built-in component.

CROSS REFERENCE TO RELATED PATENT APPLICATION

The present application claims the right of priority of Japan patent application No. 2012-279840 (filing date: Dec. 21, 2012, title of the invention: ELECTRONIC COMPONENT PACKAGE AND METHOD FOR MANUFACTURING THE SAME), the whole contents of which are incorporated herein by reference.

EXPLANATION OF REFERENCE NUMERALS

10 Metal layer
20 Carrier (e.g., adhesive carrier)
21 Sub-carrier (e.g., adhesive sub-carrier)
21A First adhesive sub-carrier
21B Second adhesive sub-carrier
24 Supporting base of adhesive carrier
26 Adhesive layer of adhesive carrier
28 Supporting substrate
30 First electronic component
31 Second electronic component (e.g., light-emitting element in case of light-emitting package)
35 Electrode of first electronic component
36 Electrode of second electronic component
40 Sealing resin layer
44 Fluorescent layer
45 Indent surface portion provided in surface of sealing resin layer
46 Transparent resin layer
50 Metal plating layer
50A Metal plating pattern layer "A"
50B Metal plating pattern layer "B"
50Bb Further metal plating pattern layer "B'"
50' Dry plating layer
50A' Dry plating layer of metal plating pattern layer "A"
50B' Dry plating layer of metal plating pattern layer "B"

50" Wet plating layer
50A" Wet plating layer of metal plating pattern layer "A"
50B" Wet plating layer of metal plating pattern layer "B"
60 Resist layer
100' Precursor of electronic component package
100 Electronic component package

The invention claimed is:

1. An electronic component package, comprising:
a sealing resin layer;
first and second electronic components buried in the sealing resin layer, an electrode of each of the first and second electronic components being flush with a surface of the sealing resin layer; and
metal plating pattern layers "A" and "B", the metal plating pattern layer "A" being in connection with the electrode of the first electronic component, the metal plating pattern layer "B" being in connection with the electrode of the second electronic component,
wherein a part of the surface of the sealing resin layer is provided as an indent surface portion forming a stepped portion that provides different plane levels between the first and second electronic components, and the electrode of either one of the first and second electronic components is flush with the indent surface portion, and thereby the electrode of the first electronic component and the electrode of the second electronic component are on the different plane levels from each other, and
wherein each of the metal plating pattern layers "A" and "B" has a layered structure of a wet plating layer and a dry plating layer, the wet plating layer being located relatively outside, the dry plating layer being located relatively inside.

2. The electronic component package according to claim 1, wherein a thickness of the metal plating pattern layer "A" and a thickness of the metal plating pattern layer "B" differ from each other.

3. The electronic component package according to claim 1, wherein an outside surface of the wet plating layer of the metal plating pattern layer "A" is on the same plane level as an outside surface of the wet plating layer of the metal plating pattern layer "B".

4. The electronic component package according to claim 3, wherein a thickness of the metal plating pattern layer "A" and a thickness of the metal plating pattern layer "B" differ from each other, and
wherein a difference in thickness between the metal plating pattern layers "A" and "B" is in the range of 2 μm to 100 μm.

5. The electronic component package according to claim 1, wherein the metal plating pattern layer "A" comprises a further metal plating pattern layer "A'", and the metal plating pattern layer "B" comprises a further metal plating pattern layer "B'", the further metal plating pattern layer "A'" being in contact with a sealing resin layer's surface which is flush with the electrode of the first electronic component, the further metal plating pattern layer "B'" being in contact with a sealing resin layer's surface which is flush with the electrode of the second electronic component, and
wherein a thickness of the further metal plating pattern layer "A'" is different from that of the metal plating pattern layer "A", and a thickness of the further metal plating pattern layer "B'" is different from that of the metal plating pattern layer "B".

6. The electronic component package according to claim 1, wherein at least a part of the metal plating pattern layers "A" and/or "B" serves as a heat-releasing part of the electronic component package.

7. The electronic component package according to claim 1, wherein the dry plating layer has a thickness of 100 nm to 1000 nm, whereas the wet plating layer has a thickness of 4 μm to 500 μm.

8. The electronic component package according to claim 1, wherein the dry plating layer comprises at least one kind of a metal material selected from a group consisting of Ti, Cr and Ni, whereas the wet plating layer comprises at least one kind of a metal material selected from a group consisting of Cu, Ni and Al.

9. The electronic component package according to claim 1, wherein a light-emitting element is provided as the electronic component, and
instead of the sealing resin layer, a fluorescent layer is provided surrounding the light-emitting element, and also a transparent resin layer is provided such that the light-emitting element and the fluorescent layer are covered with the transparent resin layer.

* * * * *